(12) United States Patent
Yamagiwa et al.

(10) Patent No.: US 7,732,833 B2
(45) Date of Patent: Jun. 8, 2010

(54) HIGH-VOLTAGE SEMICONDUCTOR SWITCHING ELEMENT

(75) Inventors: Hiroto Yamagiwa, Hyogo (JP); Takashi Saji, Osaka (JP)

(73) Assignee: Panasonic Corporation, Osaka (JP)

( * ) Notice: Subject to any disclaimer, the term of this patent is extended or adjusted under 35 U.S.C. 154(b) by 114 days.

(21) Appl. No.: 12/208,615

(22) Filed: Sep. 11, 2008

(65) Prior Publication Data
US 2009/0085061 A1 Apr. 2, 2009

(30) Foreign Application Priority Data
Oct. 1, 2007 (JP) .............................. 2007-257228

(51) Int. Cl.
H01L 21/02 (2006.01)
(52) U.S. Cl. ................... 257/139; 257/138; 257/142; 257/147; 257/152; 257/153; 257/E21.181; 257/E25.024; 257/E29.027; 257/E29.066; 257/E29.214
(58) Field of Classification Search ......... 257/138–153, 257/335–342, 654, 685–691, E21.181, E25.024, 257/E20.027, E29.066, E29.214, 259
See application file for complete search history.

(56) References Cited
U.S. PATENT DOCUMENTS

| 4,994,904 | A | | 2/1991 | Nakagawa et al. | |
|---|---|---|---|---|---|
| 5,202,578 | A | * | 4/1993 | Hideshima | 257/685 |
| 5,317,171 | A | * | 5/1994 | Shekar et al. | 257/138 |
| 5,442,216 | A | * | 8/1995 | Gough | 257/355 |
| 5,530,277 | A | | 6/1996 | Otsuki et al. | |
| 5,701,023 | A | * | 12/1997 | Bulucea et al. | 257/341 |
| 5,894,164 | A | * | 4/1999 | Funaki et al. | 257/654 |
| 5,998,811 | A | * | 12/1999 | Huang | 257/153 |
| 7,247,926 | B2 | * | 7/2007 | Losehand | 257/592 |
| 2009/0026967 | A1 | * | 1/2009 | Mazumder et al. | 315/159 |
| 2009/0085060 | A1 | * | 4/2009 | Yamagiwa et al. | 257/139 |

FOREIGN PATENT DOCUMENTS

| JP | 2-138773 | 5/1990 |
|---|---|---|
| JP | 07-297387 | 11/1995 |
| JP | 09-260592 | 10/1997 |

* cited by examiner

Primary Examiner—Michael S Lebentritt
(74) Attorney, Agent, or Firm—McDermott Will & Emery LLP

(57) ABSTRACT

In a base region of a first conductivity type, at least one emitter region of a second conductivity type and at least one sense region of the second conductivity type, spaced away from the emitter region, are selectively formed. The emitter region and the sense region are located so as to be aligned in a second direction perpendicular to a first direction going from a collector region of the first conductivity type, which is formed so as to be spaced away from the base region, toward the base region. The width of the sense region, the width of the emitter region, the width of a part of the base region that is adjacent to the sense region, and the width of a part of the base region that is adjacent to the emitter region in the second direction are set in such a manner that a sense ratio varies in a desired manner in accordance with variation in collector current.

36 Claims, 19 Drawing Sheets

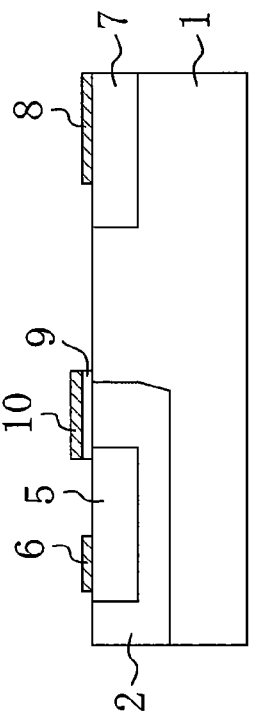
FIG. 1B
FIG. 1C
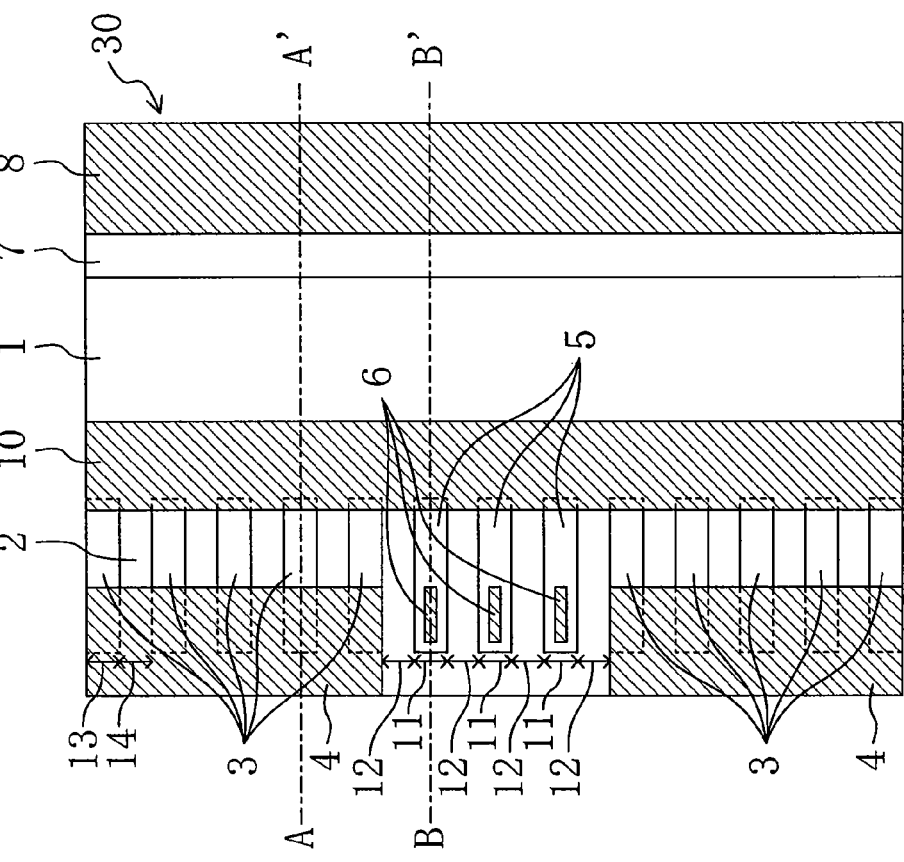
FIG. 1A

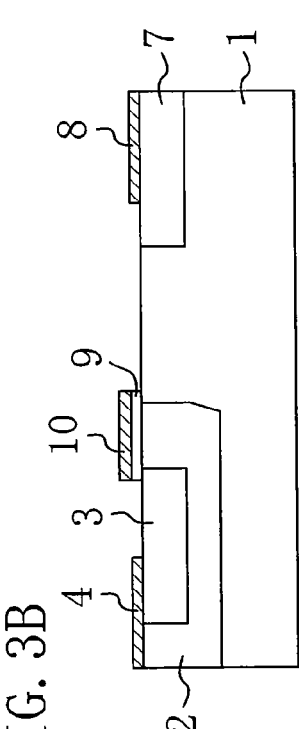
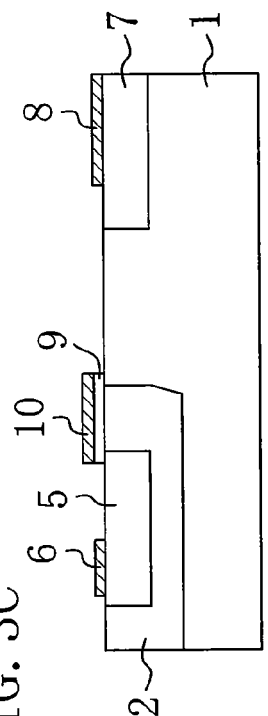
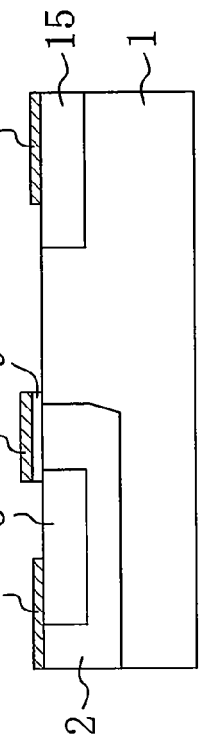
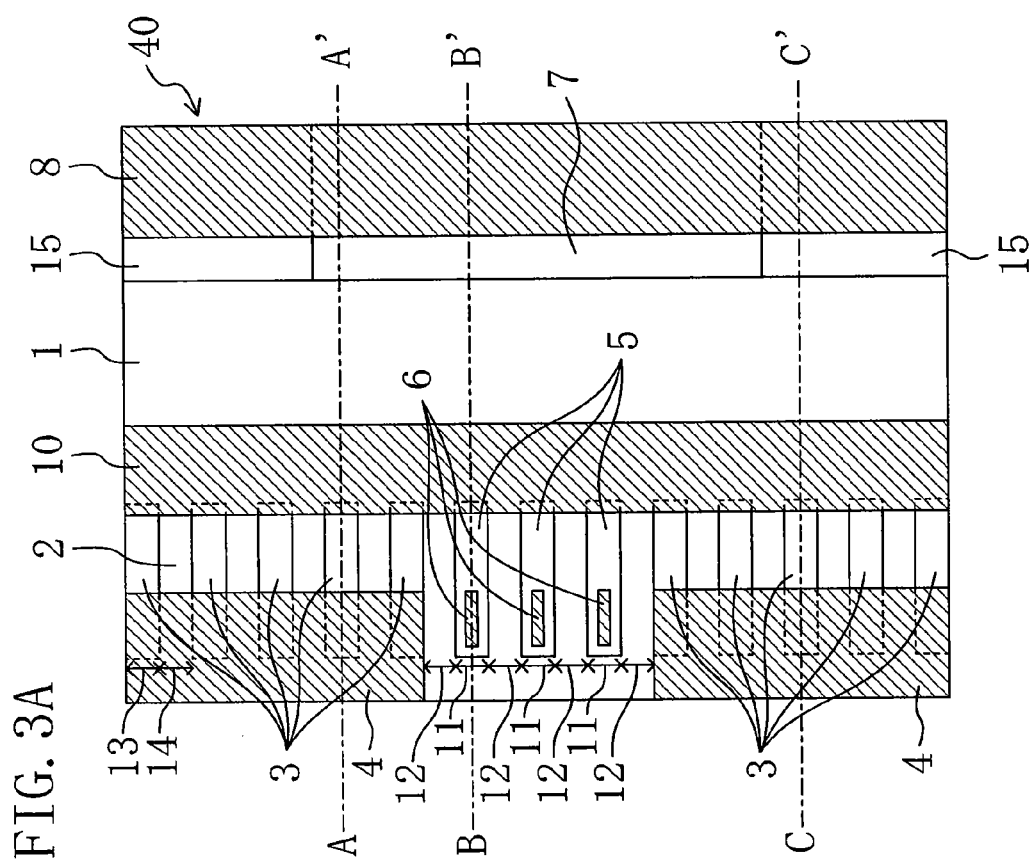

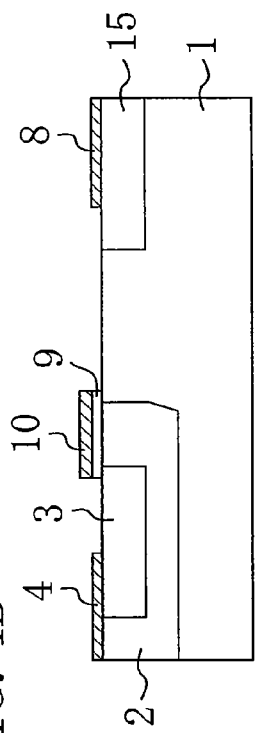
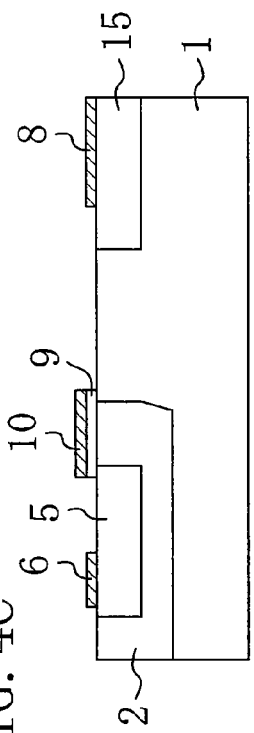
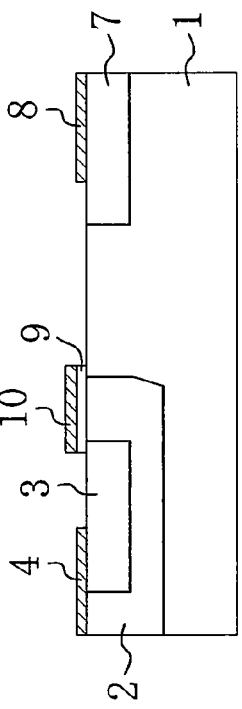
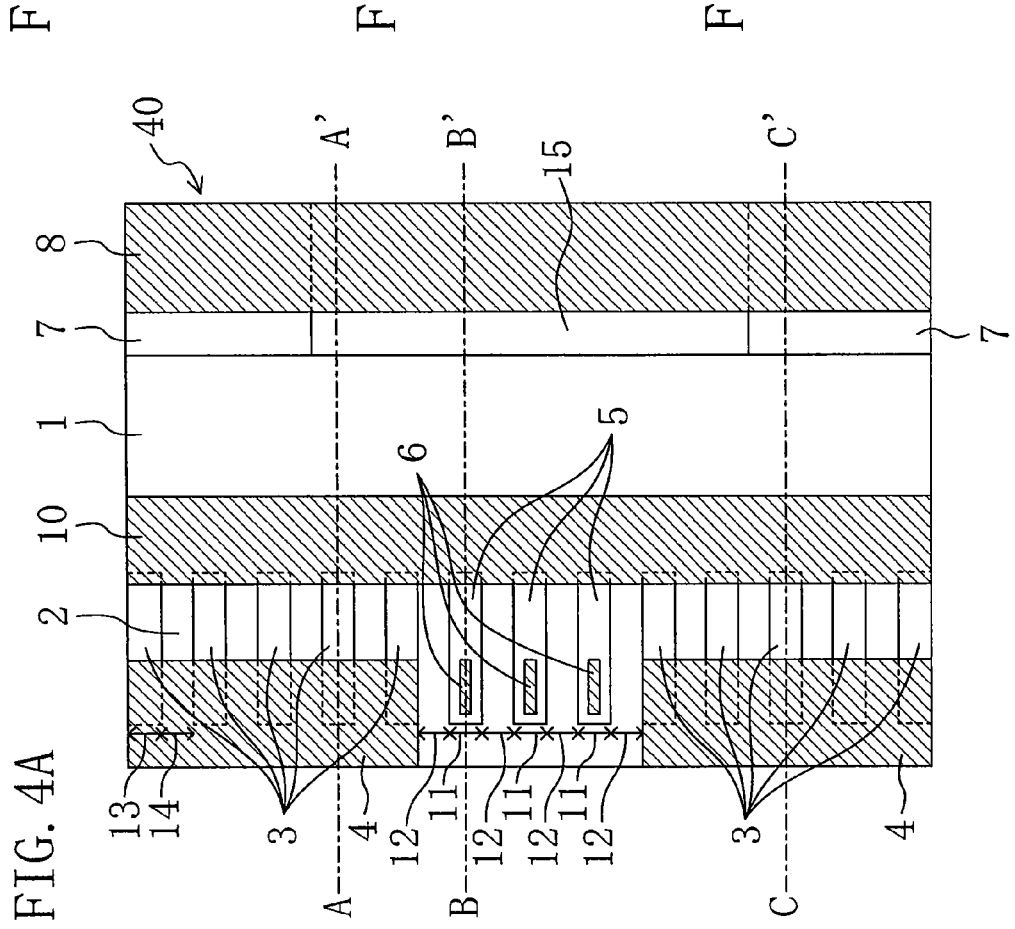

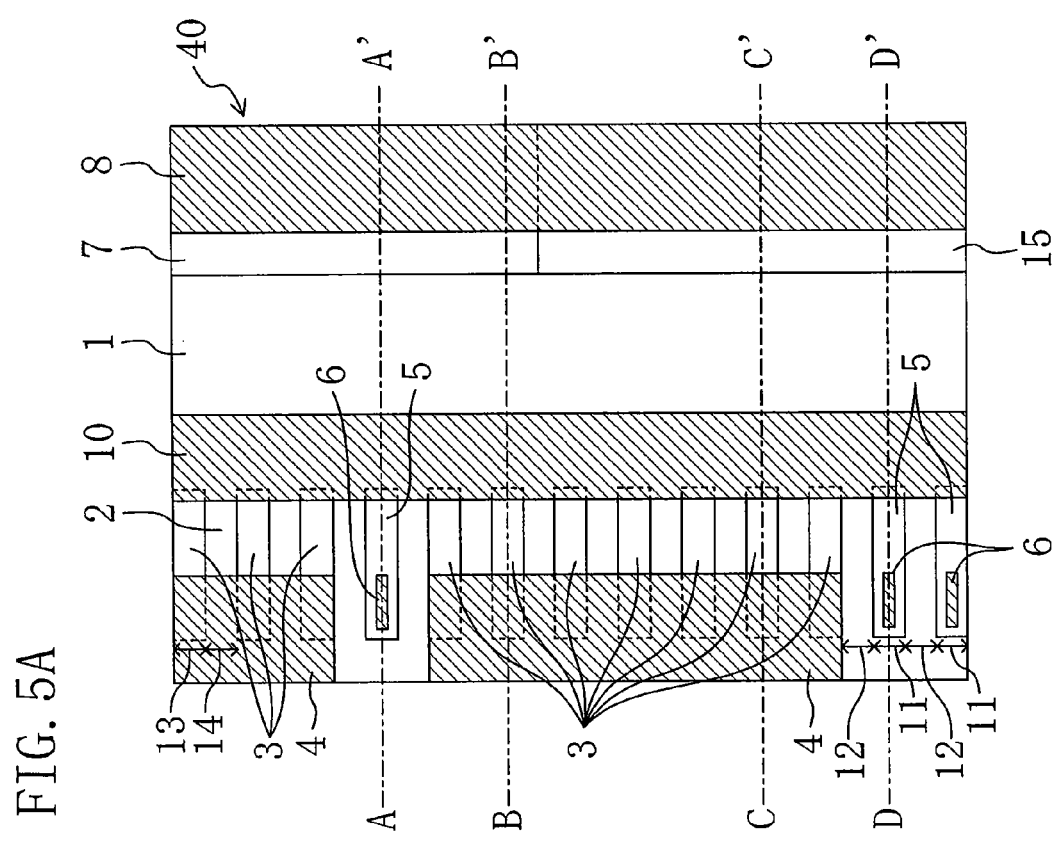
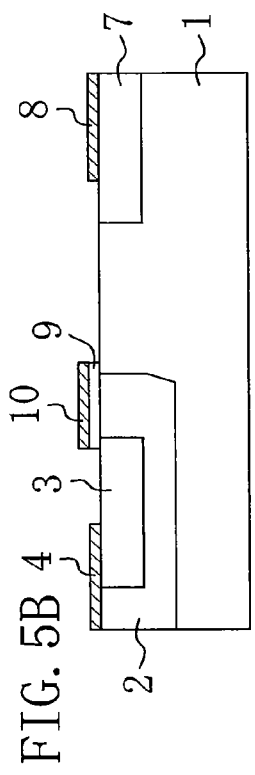
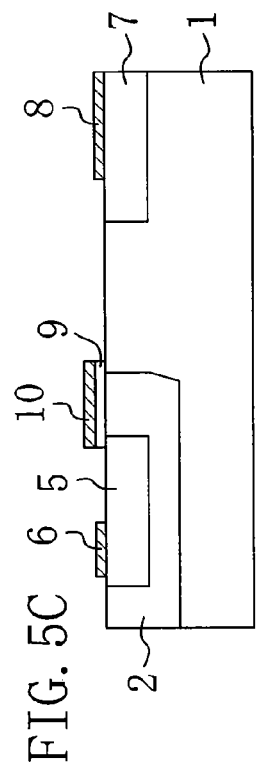
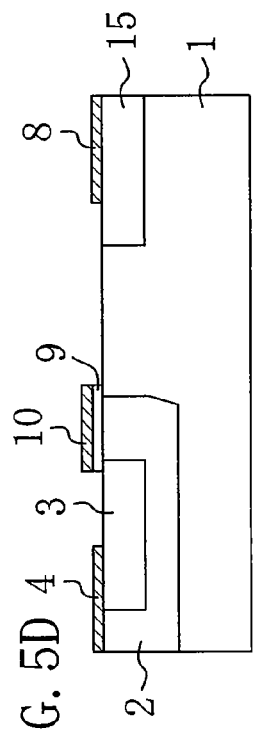
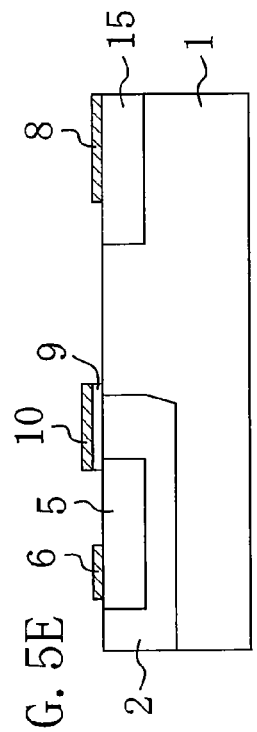

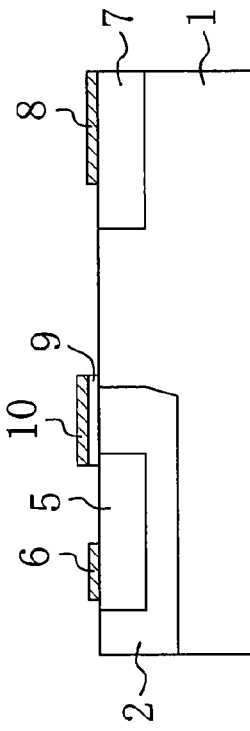
FIG. 8B
FIG. 8C
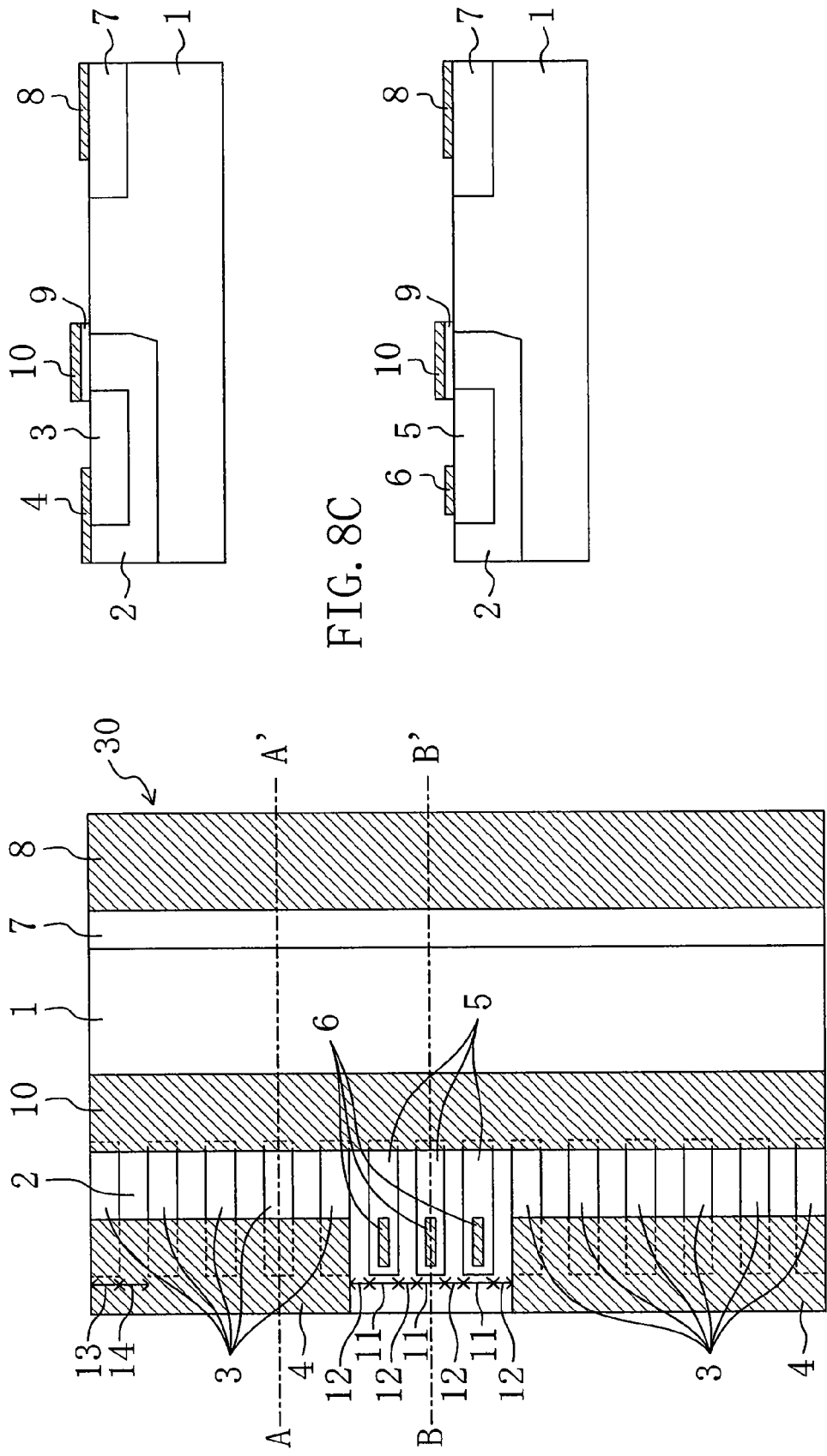
FIG. 8A

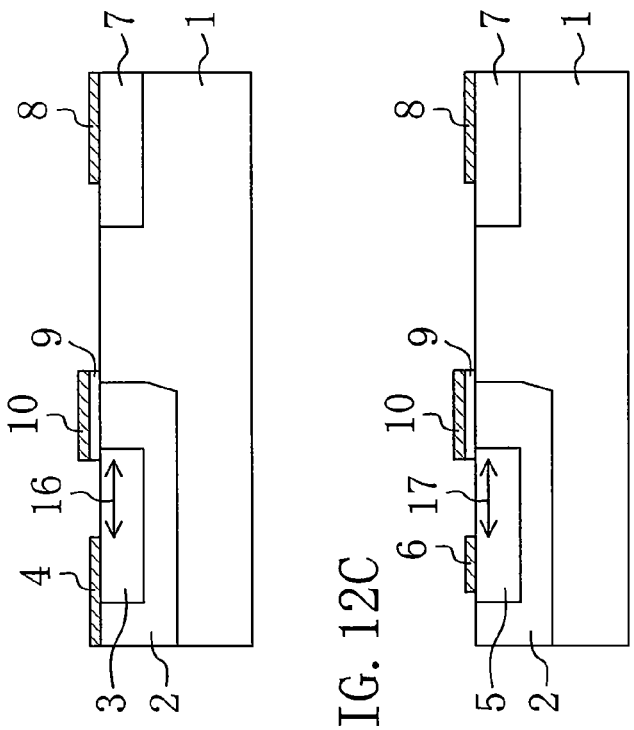
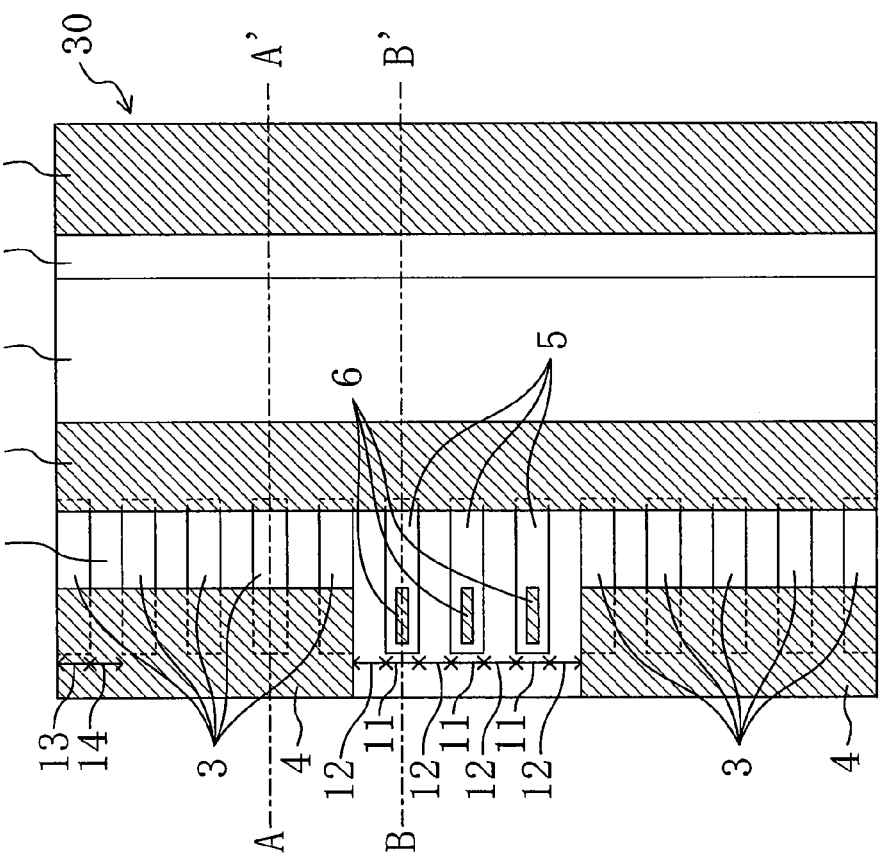

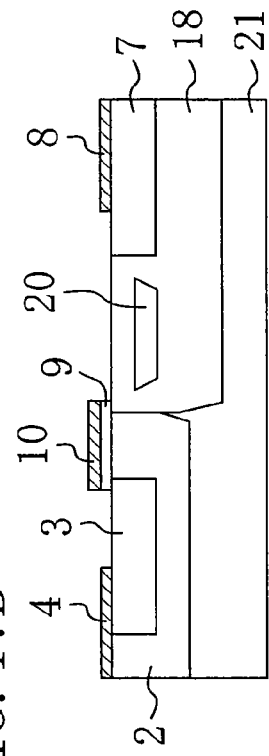
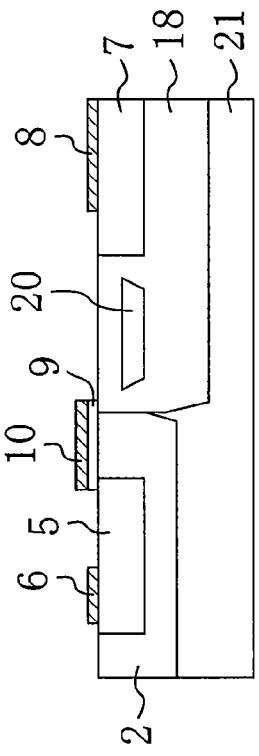
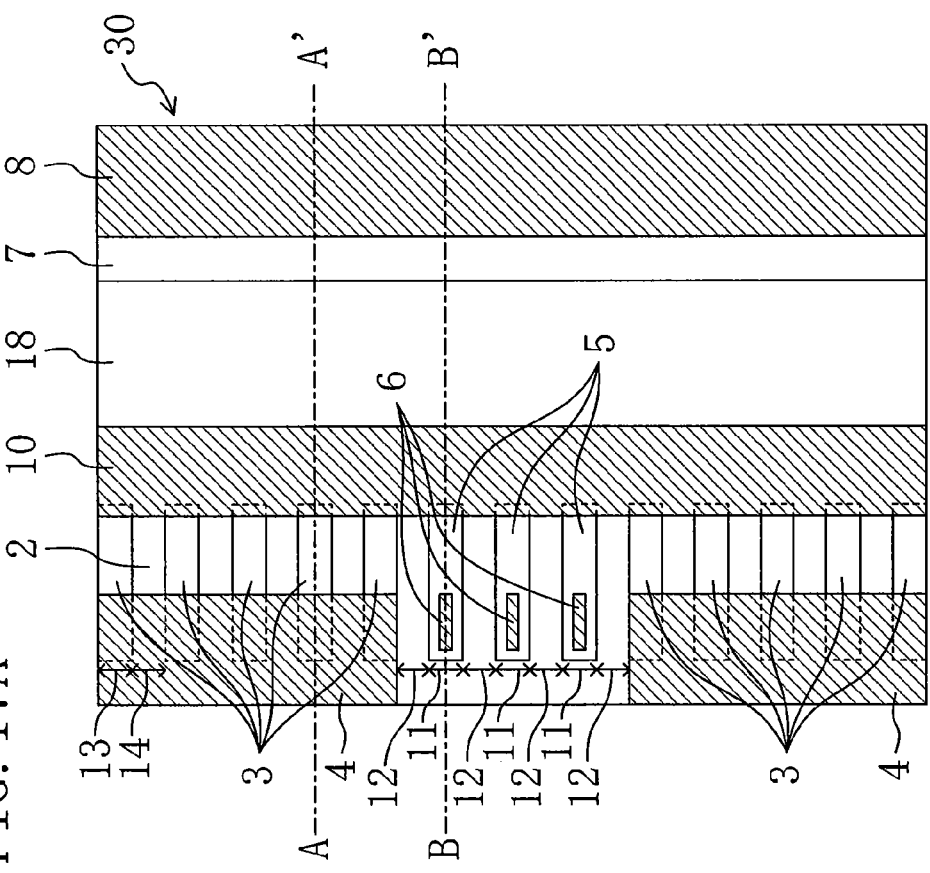

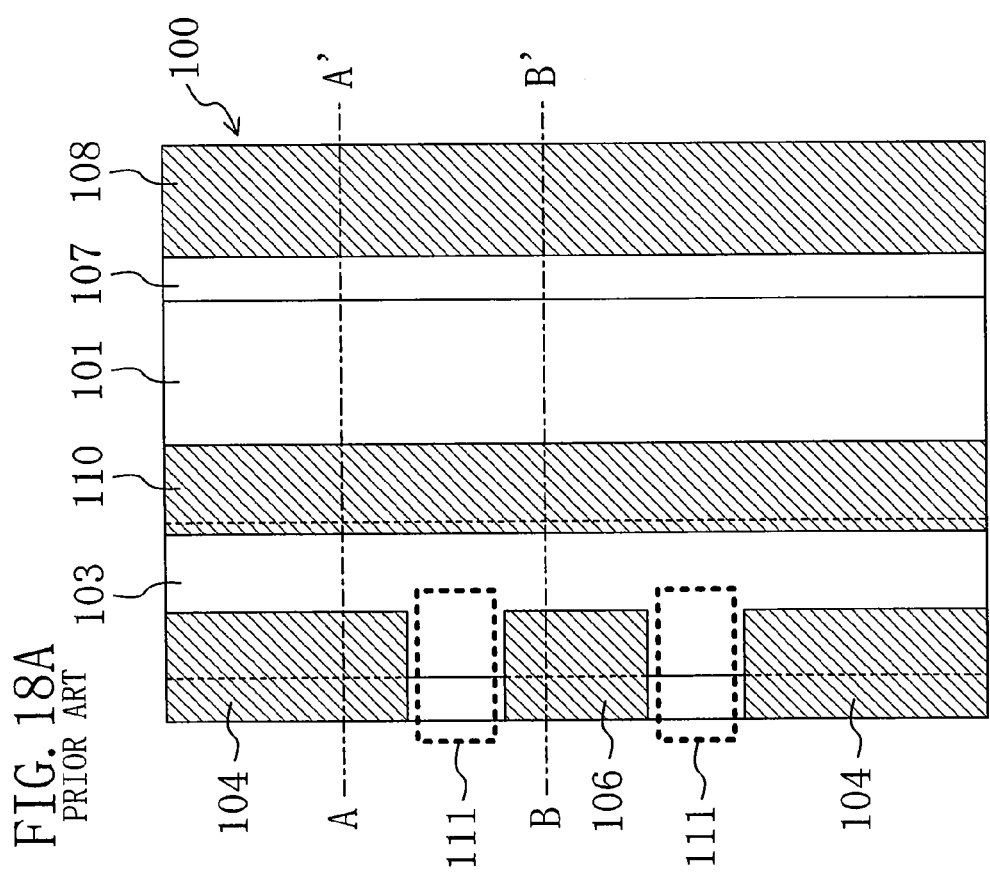
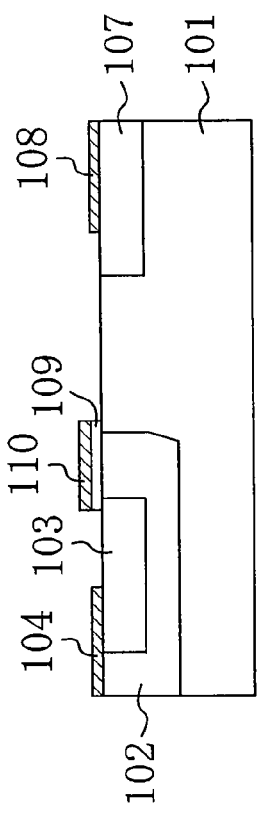
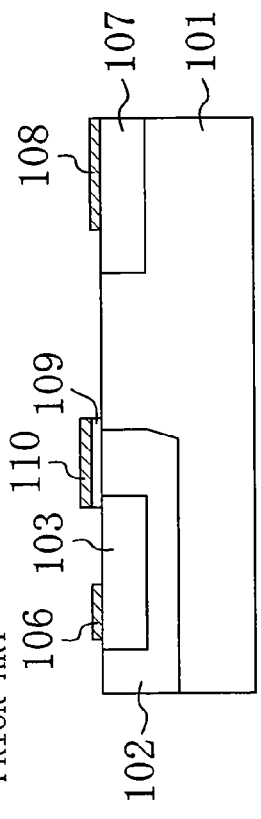
FIG. 18A PRIOR ART
FIG. 18B PRIOR ART
FIG. 18C PRIOR ART

US 7,732,833 B2

HIGH-VOLTAGE SEMICONDUCTOR SWITCHING ELEMENT

BACKGROUND OF THE INVENTION

1. Field of the Invention

The present invention relates to a semiconductor switching element with a high-breakdown voltage (which will be hereinafter referred to as a "high-voltage semiconductor switching element") including an insulated gate switching element, and more particularly relates to a high-voltage semiconductor switching element having an overcurrent protection function to protect the switching element from an overcurrent.

2. Description of the Related Art

FIGS. 18A to 18C illustrate the configuration of a typical lateral insulated gate bipolar transistor (hereinafter referred to as an "IGBT"). FIG. 18A is a plan view of the conventional lateral IGBT 100, and FIGS. 18B and 18C are cross-sectional views taken along the lines A-A' and B-B' in FIG. 18A, respectively. In the lateral IGBT 100 shown in FIGS. 18A to 18C, a P-type base region 102 is formed in a surface portion of an N-type semiconductor substrate 101, and an N-type emitter region 103 is formed in a surface portion of the base region 102. A gate insulating film 109 is formed on the base region 102 so as to extend from a part of the emitter region 103 to at least a part of the semiconductor substrate 101, and a gate electrode 110 is formed on the gate insulating film 109. Furthermore, a P-type collector region 107 is formed in another surface portion of the semiconductor substrate 101 so as to be spaced away from the base region 102. A collector electrode 108, which is electrically connected with the collector region 107, is formed on the surface of the collector region 107, while emitter electrodes 104, which are electrically connected with the emitter region 103 and the base region 102, are formed on the surfaces of the emitter region 103 and the base region 102.

A semiconductor device including a lateral IGBT thus configured is often used with an inductive load connected between the collector electrode of the lateral IGBT and a power supply. If a failure occurs in such a situation, the inductive load is short-circuited, causing a current more than several times a rated current to pass through the lateral IGBT. When the load is thus short-circuited, it is necessary to sense the overcurrent so as to interrupt the gate voltage or the collector voltage, because otherwise there would be a thermal breakdown in the lateral IGBT due to the temperature increase.

Therefore, in the lateral IGBT 100 shown FIGS. 18A to 18C, a sense electrode 106, which is electrically connected with the emitter region 103 and the base region 102, is formed on the surfaces of the emitter region 103 and the base region 102, each located in the predetermined area, so as to be spaced away from the emitter electrodes 104. That is, regions 111 are present between the sense electrode 106 and the emitter electrodes 104.

FIG. 19 illustrates an example of the rough circuit configuration of a semiconductor device having an overcurrent protection function for the lateral IGBT 100 shown in FIGS. 18A to 18C. In FIG. 19, the same members as those shown in FIGS. 18A to 18C are identified by the same reference numerals, and descriptions thereof will be thus omitted herein. As shown in FIG. 19, the sense electrode 106 and each emitter electrode 104 are electrically connected with each other through a sense resistor 201. In this example, an overcurrent sensing circuit 200, which is electrically connected with the sense electrode 106, is composed of a voltage comparator 202, a reference voltage circuit 203, and the aforementioned sense resistor 201, both of which are connected to the voltage comparator 202. In the semiconductor device shown in FIG. 19, a sense current 204 flows through the sense resistor 201 toward the emitter electrode 104, and a voltage generated at this time between both ends of the sense resistor 201 is compared with a voltage generated by the reference voltage circuit 203 by the voltage comparator 202. And a collector current 205 passing through the lateral IGBT 100 is controlled based on the difference between these two voltages.

[Patent Document 1] Japanese Laid-Open Publication No. 2-138773
[Patent Document 2] Japanese Laid-Open Publication No. 9-260592
[Patent Document 3] Japanese Laid-Open Publication No. 7-297387

SUMMARY OF THE INVENTION

However, the conventional lateral IGBT 100 has the following problem particularly with the relation between the sense current 204 and the collector current 205.

The sense current 204 is a current flowing from the collector electrode 108 through the collector region 107, the semiconductor substrate 101, the base region 102, and the emitter region 103 to the sense electrode 106 in the lateral IGBT 100. On the other hand, the collector current 205 is a current flowing from the collector electrode 108 through the collector region 107, the semiconductor substrate 101, the base region 102, and the emitter region 103 to the emitter electrodes 104 in the lateral IGBT 100. As stated above, since the sense electrode 106 and the emitter electrodes 104 are electrically isolated from each other, the regions 111, in which neither the emitter electrodes 104 nor the sense electrode 106 exist, are present on the surfaces of the base region 102 and the emitter region 103. The sense current 204 contains not only a current from a part of the collector region 107 that faces the sense electrode 106 but also currents coming from parts of the collector region 107 that face the regions 111. Thus, when the collector current 205 is small, the ratio of the collector current 205 to the sense current 204 (i.e., the collector current/the sense current, which will be hereinafter called the sense ratio) is decreased because of the existence of the currents that come into the sense current 204 from the parts of the collector region 107 that face the regions 111. On the other hand, when the collector current 205 is increased, the sense current 204 is also increased, but the density of currents flowing into the emitter region 103 (i.e., the parts under the emitter electrodes 104) and into a sense region (i.e., the part of the emitter region 103 under the sense electrode 106) is fixed, and therefore, the ratio of the currents coming from the collector region 107 into the sense region (i.e., the currents coming into the sense region from the parts of the collector region 107 that face the regions 111) is decreased relatively. Consequently, as the collector current 205 is increased, the sense ratio is increased. In this way, the conventional lateral IGBT has a problem in that the sense ratio varies in accordance with variations in the collector current.

The sense ratio is also dependent on operating temperature. To be specific, in a bipolar device, such as an IGBT, as temperature increases, bipolar operation becomes more evident. In an IGBT, in particular, the amount of hole current increases at high temperatures, however, since the density of currents flowing into the emitter region and the sense region is fixed as stated previously, the contribution ratio of part of the sense current that flows into the sense region becomes smaller at high temperatures than at room temperatures, and thus the sense ratio is increased at high temperatures. Therefore, the conventional lateral IGBT has a problem in that the sense ratio is increased as temperature increases.

As in the semiconductor device illustrated in FIG. 19, when a method for controlling a collector current in accordance with a sense current is adopted, a control circuit must be designed in such a manner as to compensate for the above-described collector current dependence and temperature dependence of the sense ratio. However, since the control circuit also has temperature dependence and the like, it becomes very difficult to design the semiconductor device.

In view of the foregoing, an object of the invention is to provide a high-voltage semiconductor switching element in which the collector current dependence and temperature dependence of a sense ratio are controllable by the configuration of the switching element itself.

In order to achieve the object, a first inventive high-voltage semiconductor switching element includes: a base region of a first conductivity type formed in a semiconductor substrate of a second conductivity type; at least one emitter region of the second conductivity type selectively formed in the base region; at least one sense region of the second conductivity type selectively formed in the base region so as to be spaced away from the emitter region; a collector region of the first conductivity type formed in the semiconductor substrate so as to be spaced away from the base region; a gate insulating film formed at least on a part of the base region located closer to the collector region with respect to the emitter region; a gate electrode formed on the gate insulating film; a collector electrode formed above the semiconductor substrate and electrically connected with the collector region; an emitter electrode formed above the semiconductor substrate and electrically connected with both the base region and the emitter region; and a sense electrode formed above the semiconductor substrate and electrically connected with the sense region. The emitter region and the sense region are located so as to be aligned in a second direction perpendicular to a first direction going from the collector region toward the base region, and the width of the sense region, the width of the emitter region, the width of a part of the base region that is adjacent to the sense region, and the width of a part of the base region that is adjacent to the emitter region in the second direction are set in such a manner that a sense ratio, which is a ratio of a collector current to a sense current, varies in a desired manner in accordance with variation in the collector current.

In the invention, a "high-voltage semiconductor switching element" means a switching element which has a breakdown voltage of approximately 200 V or higher, for example, for a drain voltage, when a gate voltage is 0 V.

In the first inventive high-voltage semiconductor switching element, it is possible to control the amount of carriers of the first conductivity type emitted from the emitter region per unit width and the amount of carriers of the first conductivity type emitted from the sense region per unit width by adjusting the width of the sense region of the second conductivity type, the width of the emitter region of the second conductivity type, the width of the part of the base region of the first conductivity type that is adjacent to the sense region, and the width of the part of the base region of the first conductivity type that is adjacent to the emitter region. Consequently, the collector current dependence of the sense ratio is controllable.

Specifically, in the first inventive high-voltage semiconductor switching element, for example, a ratio of the width of the part of the base region that is adjacent to the sense region to the width of the sense region in the second direction is set equal to a ratio of the width of the part of the base region that is adjacent to the emitter region to the width of the emitter region in the second direction, thereby making the sense ratio be kept constant irrespective of the variation in the collector current. In this case, the width of the sense region, the width of the emitter region, the width of the part of the base region that is adjacent to the sense region, and the width of the part of the base region that is adjacent to the emitter region in the second direction may be set equal to each other.

Alternatively, in the first inventive high-voltage semiconductor switching element, for example, a ratio of the width of the part of the base region that is adjacent to the sense region to the width of the sense region in the second direction is set greater than a ratio of the width of the part of the base region that is adjacent to the emitter region to the width of the emitter region in the second direction, thereby making the sense ratio increase as the collector current increases.

Alternatively, in the first inventive high-voltage semiconductor switching element, for example, a ratio of the width of the part of the base region that is adjacent to the sense region to the width of the sense region in the second direction is set smaller than a ratio of the width of the part of the base region that is adjacent to the emitter region to the width of the emitter region in the second direction, thereby making the sense ratio decrease as the collector current increases.

A second inventive high-voltage semiconductor switching element includes: a base region of a first conductivity type formed in a semiconductor substrate of a second conductivity type; at least one emitter region of the second conductivity type selectively formed in the base region; at least one sense region of the second conductivity type selectively formed in the base region so as to be spaced away from the emitter region; a collector region of the first conductivity type formed in the semiconductor substrate so as to be spaced away from the base region; a drain region of the second conductivity type formed in the semiconductor substrate so as to be spaced away from the base region; a gate insulating film formed at least on a part of the base region located closer to the collector region with respect to the emitter region; a gate electrode formed on the gate insulating film; a collector electrode formed above the semiconductor substrate and electrically connected with both the collector region and the drain region; an emitter electrode formed above the semiconductor substrate and electrically connected with both the base region and the emitter region; and a sense electrode formed above the semiconductor substrate and electrically connected with the sense region. The emitter region and the sense region are located so as to be aligned in a second direction perpendicular to a first direction going from the collector region toward the base region, and the width of the sense region, the width of the emitter region, the width of a part of the base region that is adjacent to the sense region, and the width of a part of the base region that is adjacent to the emitter region in the second direction are set in such a manner that a ratio of a collector current to a sense current varies in a desired manner in accordance with variation in the collector current.

In the second inventive high-voltage semiconductor switching element, the collector region and the drain region spaced away from the base region are both formed, thereby achieving a high-voltage semiconductor switching element in which loss is decreased under any load conditions from light load to heavy load. Also, it is possible to control the amount of carriers of the first conductivity type emitted from the emitter region per unit width and the amount of carriers of the first conductivity type emitted from the sense region per unit width by adjusting the width of the sense region of the second conductivity type, the width of the emitter region of the second conductivity type, the width of the part of the base region of the first conductivity type that is adjacent to the sense region, and the width of the part of the base region of the first conductivity type that is adjacent to the emitter region. Consequently, the collector current dependence of the sense ratio is controllable.

To be specific, in the second inventive high-voltage semiconductor switching element, for example, a ratio of the width of the part of the base region that is adjacent to the sense region to the width of the sense region in the second direction is set equal to a ratio of the width of the part of the base region that is adjacent to the emitter region to the width of the emitter region in the second direction, thereby making the sense ratio be kept constant irrespective of the variation in the collector current. In this case, the width of the sense region, the width of the emitter region, the width of the part of the base region that is adjacent to the sense region, and the width of the part of the base region that is adjacent to the emitter region in the second direction may be set equal to each other.

Alternatively, in the second inventive high-voltage semiconductor switching element, for example, a ratio of the width of the part of the base region that is adjacent to the sense region to the width of the sense region in the second direction is set greater than a ratio of the width of the part of the base region that is adjacent to the emitter region to the width of the emitter region in the second direction, thereby making the sense ratio increase as the collector current increases.

Alternatively, in the second inventive high-voltage semiconductor switching element, for example, a ratio of the width of the part of the base region that is adjacent to the sense region to the width of the sense region in the second direction is set smaller than a ratio of the width of the part of the base region that is adjacent to the emitter region to the width of the emitter region in the second direction, thereby making the sense ratio decrease as the collector current increases.

Also, in the second inventive high-voltage semiconductor switching element, the sense region and the collector region may be located so as to face each other with the gate electrode interposed therebetween, or the sense region and the drain region may be located so as to face each other with the gate electrode interposed therebetween. Alternatively, a plurality of the sense regions may be formed, and at least one of the sense regions and the collector region may located so as to face each other with the gate electrode interposed therebetween, and the other sense regions and the drain region may be located so as to face each other with the gate electrode interposed therebetween.

A third inventive high-voltage semiconductor switching element includes: a base region of a first conductivity type formed in a semiconductor substrate of a second conductivity type; at least one emitter region of the second conductivity type selectively formed in the base region; at least one sense region of the second conductivity type selectively formed in the base region so as to be spaced away from the emitter region; a collector region of the first conductivity type formed in the semiconductor substrate so as to be spaced away from the base region; a gate insulating film formed at least on a part of the base region located closer to the collector region with respect to the emitter region; a gate electrode formed on the gate insulating film; a collector electrode formed above the semiconductor substrate and electrically connected with the collector region; an emitter electrode formed above the semiconductor substrate and electrically connected with both the base region and the emitter region; and a sense electrode formed above the semiconductor substrate and electrically connected with the sense region. The emitter region and the sense region are located so as to be aligned in a second direction perpendicular to a first direction going from the collector region toward the base region, and the resistance of a part of the emitter region that is located between the emitter electrode and the gate electrode is equal to the resistance of a part of the sense region that is located between the sense electrode and the gate electrode.

In the third inventive high-voltage semiconductor switching element, the resistance of the part of the emitter region that is located between the emitter electrode and the gate electrode is equal to the resistance of the part of the sense region that is located between the sense electrode and the gate electrode. Therefore, when a collector current of such a magnitude as to cause conductivity modulation in the high-voltage semiconductor switching element flows, the current density of an electron current that flows from the sense region is equal to the current density of an electron current that flows from the emitter region. Thus, even when a collector current of such a magnitude as to cause conductivity modulation in the high-voltage semiconductor switching element flows, variations in sense ratio are suppressed, thereby enabling the collector current flowing in the high-voltage semiconductor switching element to be controlled easily.

In addition, in the third inventive high-voltage semiconductor switching element, since the resistance of the part of the emitter region that is located between the emitter electrode and the gate electrode is equal to the resistance of the part of the sense region that is located between the sense electrode and the gate electrode, it is possible to make an increase in each resistance resulting from an increase in temperature be equal. Thus, the temperature dependence of the sense ratio is eliminated.

A fourth inventive high-voltage semiconductor switching element includes: a base region of a first conductivity type formed in a semiconductor substrate of a second conductivity type; at least one emitter region of the second conductivity type selectively formed in the base region; at least one sense region of the second conductivity type selectively formed in the base region so as to be spaced away from the emitter region; a collector region of the first conductivity type formed in the semiconductor substrate so as to be spaced away from the base region; a drain region of the second conductivity type formed in the semiconductor substrate so as to be spaced away from the base region; a gate insulating film formed at least on a part of the base region located closer to the collector region with respect to the emitter region; a gate electrode formed on the gate insulating film; a collector electrode formed above the semiconductor substrate and electrically connected with both the collector region and the drain region; an emitter electrode formed above the semiconductor substrate and electrically connected with both the base region and the emitter region; and a sense electrode formed above the semiconductor substrate and electrically connected with the sense region. The emitter region and the sense region are located so as to be aligned in a second direction perpendicular to a first direction going from the collector region toward the base region; and the resistance of a part of the emitter region that is located between the emitter electrode and the gate electrode is equal to the resistance of a part of the sense region that is located between the sense electrode and the gate electrode.

In the fourth inventive high-voltage semiconductor switching element, the resistance of the part of the emitter region that is located between the emitter electrode and the gate electrode is equal to the resistance of the part of the sense region that is located between the sense electrode and the gate electrode. Therefore, when a collector current of such a magnitude as to cause conductivity modulation in the high-voltage semiconductor switching element flows, the current density of an electron current that flows from the sense region is equal to the current density of an electron current that flows from the emitter region. Thus, even when a collector current of such a magnitude as to cause conductivity modulation in the high-voltage semiconductor switching element flows, variations in sense ratio are suppressed, thereby enabling the collector current flowing in the high-voltage semiconductor switching element to be controlled easily.

In addition, in the fourth inventive high-voltage semiconductor switching element, since the resistance of the part of the emitter region that is located between the emitter electrode and the gate electrode is equal to the resistance of the part of the sense region that is located between the sense electrode and the gate electrode, it is possible to make an increase in each resistance resulting from an increase in temperature be equal. Thus, the temperature dependence of the sense ratio is eliminated.

In the fourth inventive high-voltage semiconductor switching element, the sense region and the collector region may be located so as to face each other with the gate electrode interposed therebetween, or the sense region and the drain region may be located so as to face each other with the gate electrode interposed therebetween. Alternatively, a plurality of the sense regions may be formed, and at least one of the sense regions and the collector region may be located so as to face each other with the gate electrode interposed therebetween, and the other sense regions and the drain region may be located so as to face each other with the gate electrode interposed therebetween.

In the third or fourth inventive high-voltage semiconductor switching element, the width of the emitter region and the width of the sense region in the second direction may be equal to each other, and the length of the part of the emitter region that is located between the emitter electrode and the gate electrode may be equal to the length of the part of the sense region that is located between the sense electrode and the gate electrode.

In the first to fourth inventive high-voltage semiconductor switching elements, a plurality of the sense regions are preferably formed, and the emitter region is preferably located between one of the sense regions and another one of the sense regions. Then, when a collector current of such a magnitude as to cause conductivity modulation in the high-voltage semiconductor switching elements flows, the difference between the current density of currents flowing from parts of the collector region that face the sense regions and the current density of a current flowing from a part of the collector region that faces the emitter region is reduced as compared with cases in which the sense regions are all formed in one place. Consequently, it is possible to reduce variations in the sense ratio caused by variations in the collector current and in temperature, thereby enabling the sense ratio to be kept constant.

Also, in the first to fourth inventive high-voltage semiconductor switching elements, the semiconductor substrate is preferably of the first conductivity type; each high-voltage semiconductor switching element preferably further includes a resurf region of the second conductivity type formed in the semiconductor substrate so as to be adjacent to the base region; and the collector region is preferably formed in the resurf region. In this case, in the second and fourth inventive high-voltage semiconductor switching elements, the drain region is also formed in the resurf region. Also, in this case, more preferably, the inventive high-voltage semiconductor switching elements further include a top semiconductor layer of the first conductivity type formed in a surface portion of the resurf region, and the top semiconductor layer is electrically connected with the base region, or the high-voltage semiconductor switching elements further include a buried semiconductor layer of the first conductivity type formed in the resurf region, and the buried semiconductor layer is electrically connected with the base region.

As described above, the invention relates to high-voltage semiconductor switching elements including insulated gate switching elements, and more particularly, when the invention is applied to a high-voltage semiconductor switching element, such as a lateral IGBT having an overcurrent protection function to protect the switching element from an overcurrent, the collector current dependence and temperature dependence of a sense ratio are controllable by the configuration of the switching element itself, thereby producing the excellent effect that a semiconductor device can be designed easily.

BRIEF DESCRIPTION OF THE DRAWINGS

FIG. 1A is a plan view of a high-voltage semiconductor switching element according to a first embodiment of the invention, and FIGS. 1B and 1C are cross-sectional views taken along the lines A-A' and B-B' in FIG. 1A, respectively.

FIG. 3A is a plan view of a high-voltage semiconductor switching element according to a second embodiment of the invention, and FIGS. 3B to 3D are cross-sectional views taken along the lines A-A', B-B', and C-C' in FIG. 3A, respectively.

FIG. 4A is a plan view of a high-voltage semiconductor switching element according to a third embodiment of the invention, and FIGS. 4B to 4D are cross-sectional views taken along the lines A-A', B-B', and C-C' in FIG. 4A, respectively.

FIG. 5A is a plan view of a high-voltage semiconductor switching element according to a fourth embodiment of the invention, and FIGS. 5B to 5E are cross-sectional views taken along the lines A-A', B-B', C-C', and D-D' in FIG. 5A, respectively.

FIG. 8A is a plan view of a high-voltage semiconductor switching element according to a sixth embodiment of the invention, and FIGS. 8B and 8C are cross-sectional views taken along the lines A-A' and B-B' in FIG. 8A, respectively.

FIG. 12A is a plan view of a high-voltage semiconductor switching element according to a ninth embodiment of the invention, and FIGS. 12B and 12C are cross-sectional views taken along the lines A-A' and B-B' in FIG. 12A, respectively.

FIG. 17A is a plan view of a high-voltage semiconductor switching element (including a buried semiconductor layer) according to the second modified example of the first through tenth embodiments of the invention, and FIGS. 17B and 17C are cross-sectional views taken along the lines A-A' and B-B' in FIG. 17A, respectively.

FIG. 18A is a plan view of a conventional lateral IGBT, and FIGS. 18B and 18C are cross-sectional views taken along the lines A-A' and B-B' in FIG. 18A, respectively.

DETAILED DESCRIPTION OF THE INVENTION

Figure 2B:
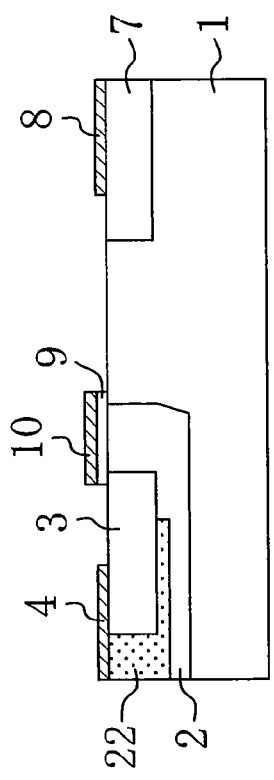
FIGS. 2B and 2C are cross-sectional views taken along the lines A-A' and B-B' in FIG. 2A, respectively.

In the following embodiments of the invention, n-channel high-voltage semiconductor switching elements will be described by way of example in which a "first conductivity type" and a "second conductivity type" in "Claims" are a P-type and an N-type, respectively. However, the invention is also applicable to p-channel high-voltage semiconductor switching elements.

First Embodiment

A high-voltage semiconductor switching element (which will be hereinafter referred to as an "IGBT") according to a first embodiment of the invention will be described with reference to the accompanying drawings.

FIG. 1A is a plan view of the IGBT according to the first embodiment of the invention, and FIGS. 1B and 1C are cross-sectional views taken along the lines A-A' and B-B' in FIG. 1A, respectively. In the IGBT 30 illustrated in FIGS. 1A to 1C, a P-type base region 2 is formed in a surface portion of an N-type semiconductor substrate 1, and one or more N-type emitter regions 3 are selectively formed in a surface portion or portions of the base region 2. The base region 2 and the emitter regions 3 are electrically connected with each other through emitter electrodes 4 formed above the semiconductor substrate 1. One or more N-type sense regions 5 are selectively formed in a surface portion or portions of the base region 2 so as to be spaced away from the emitter regions 3. Sense electrodes 6, which are electrically connected with the sense regions 5, are formed on the sense regions 5. A P-type collector region 7 is formed in another surface portion of the semiconductor substrate 1 so as to be spaced away from the base region 2. A collector electrode 8, which is electrically connected with the collector region 7, is formed on the collector region 7. Furthermore, a gate insulating film 9 is formed on the base region 2 so as to extend from parts of the emitter regions 3 to at least a part of the semiconductor substrate 1 (i.e., a part of the semiconductor substrate 1 in which doped regions, such as the base region 2 and the collector region 7, are not formed). On the gate insulating film 9, a gate electrode 10 is formed.

In this embodiment, the concentration of introduced dopant and the junction depth are the same in the N-type emitter regions 3 and in the N-type sense regions 5. Also, the emitter regions 3 and the sense regions 5 are located so as to be aligned in a second direction perpendicular to a first direction going from the collector region 7 toward the base region 2. Moreover, as a characteristic of this embodiment, the ratio of the width 12 of parts of the base region 2 that are adjacent to the N-type sense regions 5 to the width 11 of the sense regions 5 in the second direction is set equal to the ratio of the width 14 of parts of the base region 2 that are adjacent to the N-type emitter regions 3 to the width 13 of the emitter regions 3 in the second direction. Specifically, the sense regions 5, the emitter regions 3, the parts of the base region 2 that are adjacent to the sense regions 5, and the parts of the base region 2 that are adjacent to the emitter regions 3 all have the same width in the second direction. In this embodiment and the embodiments which will be described later, the parts of the base region 2 that are adjacent to the sense regions 5 mean each part of the base region 2 located between two neighboring sense regions 5 and each part of the base region 2 located between a sense region 5 and the neighboring emitter region 3 in the region in which the emitter electrodes 4 are not formed, while the parts of the base region 2 that are adjacent to the emitter regions 3 mean each part of the base region 2 located between two neighboring emitter regions 3.

The IGBT according to the first embodiment operates in the following manner.

In the IGBT 30 of this embodiment illustrated in FIGS. 1A to 1C, since holes (i.e., a collector current) emitted from the P-type collector region 7 recombine with electrons emitted from the N-type emitter regions 3 and the N-type sense regions 5, the collector current is observable by observing the electron currents (hereinafter called the source current) emitted from the N-type emitter regions 3 and the electron currents (hereinafter called the sense current) emitted from the N-type sense regions 5. Furthermore, in this embodiment, since the N-type sense regions 5 have the same concentration of introduced dopant and the same junction depth as the N-type emitter regions 3, in other words, the sense regions 5 are formed as part of the emitter regions 3, the electron currents, i.e., the sense current, emitted from the N-type sense regions 5 correspond to part of the collector current. In addition, in this embodiment, the ratio of the width 12 of the parts of the base region 2 that are adjacent to the N-type sense regions 5 to the width 11 of the sense regions 5 in the second direction is set equal to the ratio of the width 14 of the parts of the base region 2 that are adjacent to the N-type emitter regions 3 to the width 13 of the emitter regions 3 in the second direction. Thus, the amount of electrons emitted from the N-type sense regions 5 per unit width in the second direction is equal to the amount of electrons emitted from the N-type emitter regions 3 per unit width in the second direction.

Therefore, in this embodiment, a sense ratio, which is the ratio of the collector current to the sense current, is constant irrespective of the magnitude of the collector current. That is, in the high-voltage semiconductor switching element composed of the lateral IGBT, the collector current dependence of the sense ratio is controllable by the configuration of the switching element itself.

In this embodiment, the sense regions 5, the emitter regions 3, the parts of the base region 2 adjacent to the sense regions 5, and the parts of the base region 2 adjacent to the emitter regions 3 all have the same width in the second direction. Nevertheless, the width of each region is not particularly limited to a specific value, so long as the ratio of the width 12 of the parts of the base region 2 that are adjacent to the N-type sense regions 5 to the width 11 of the sense regions 5 in the second direction can be set equal to the ratio of the width 14 of the parts of the base region 2 that are adjacent to the N-type emitter regions 3 to the width 13 of the emitter regions 3 in the second direction.

Figure 2C:
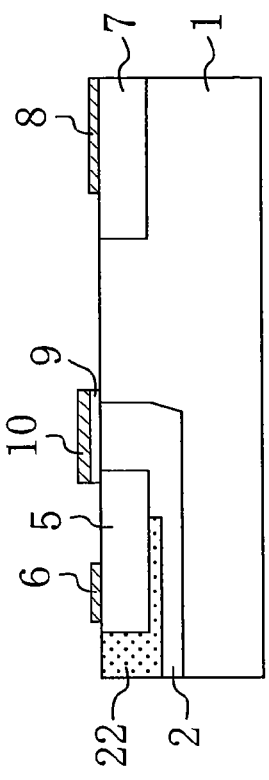
Figure 2A:
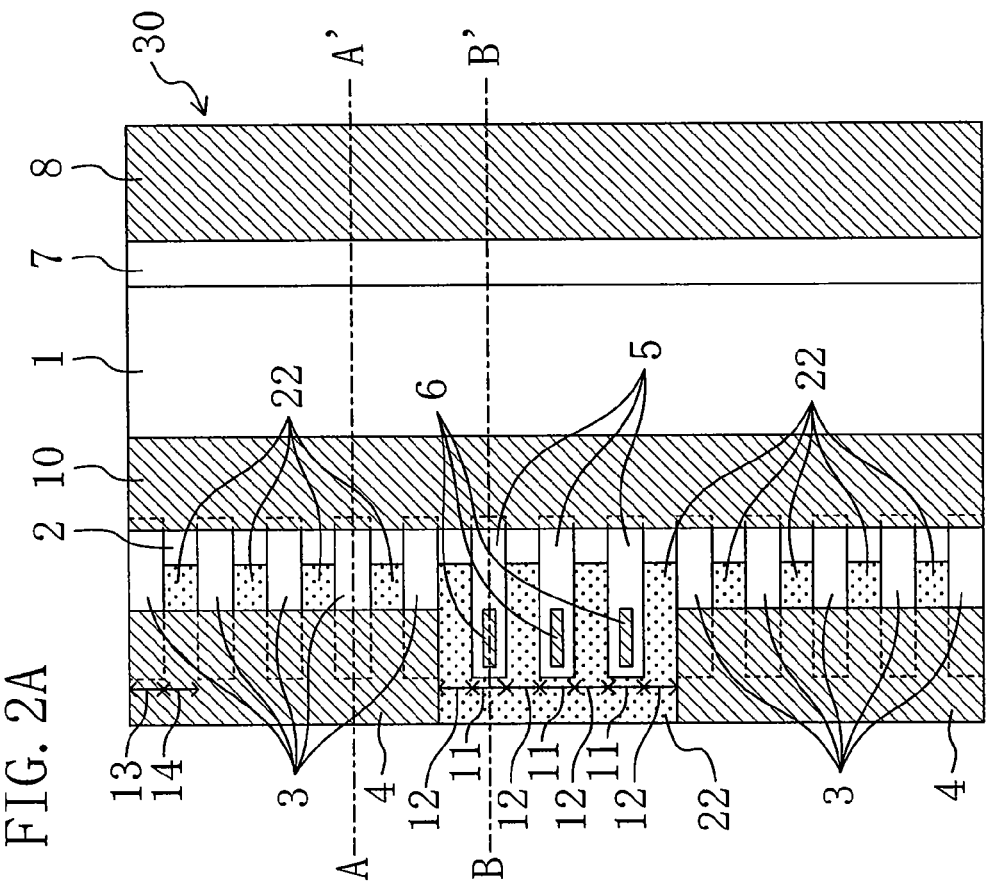
FIG. 2A is a plan view of a high-voltage semiconductor switching element according to a modified example of the first embodiment of the invention.

Moreover, in this embodiment, as shown in FIGS. 2A to 2C, for example, a heavily doped P-type base contact region 22 may be formed in the base region 2 in such a manner as to be adjacent to the emitter regions 3 and the sense regions 5. FIG. 2A is a plan view of an IGBT according to a modified example of the first embodiment of the invention, while FIGS. 2B and 2C are cross-sectional views taken along the lines A-A' and B-B' in FIG. 2A, respectively. In FIGS. 2A to 2C, the same members as those of the IGBT 30 shown in FIGS. 1A to 1C are identified by the same reference numerals, and duplicated descriptions will be thus omitted herein.

Second Embodiment

A high-voltage semiconductor switching element according to a second embodiment of the invention will be described with reference to the accompanying drawings.

FIG. 3A is a plan view of the high-voltage semiconductor switching element, specifically, a hybrid IGBT 40, according to the second embodiment of the invention. FIGS. 3B to 3D are cross-sectional views taken along the lines A-A', B-B', and C-C' in FIG. 3A, respectively. In the hybrid IGBT 40 illustrated in FIGS. 3A to 3D, the same members as those of the IGBT 30 shown in FIGS. 1A to 1C are identified by the same reference numerals, and duplicated descriptions will be thus omitted herein.

The hybrid IGBT 40 of this embodiment differs from the IGBT 30 of the first embodiment shown in FIGS. 1A to 1C in that one or more N-type drain regions 15 are formed in a surface portion or portions of a semiconductor substrate 1 so as to be spaced away from a base region 2 and that the drain regions 15 and a collector region 7 are located so as to be alternately aligned in a second direction perpendicular to a first direction going from the collector region 7 toward the base region 2. In this embodiment, a collector electrode 8 is formed above the semiconductor substrate 1 so as to be electrically connected with both the collector region 7 and the drain regions 15. Alternatively, a plurality of collector regions 7 may be formed in this embodiment.

The operation principle of the hybrid IGBT 40 of this embodiment will be briefly described below. When a voltage is applied to the collector electrode 8 of the hybrid IGBT 40, currents flow from the N-type drain regions 15 through the P-type base region 2 to emitter regions 3 (this operation will be hereinafter referred to as a "MISFET (metal insulator semiconductor field effect transistor) operation"). As these currents are increased, holes are emitted from the P-type collector region 7 (this operation will be hereinafter referred to as an "IGBT operation"). Thus, it is possible to achieve a high-voltage semiconductor switching element in which loss is decreased under any load conditions from light load to heavy load, that is, a hybrid IGBT.

In this embodiment as in the first embodiment, the concentration of introduced dopant and the junction depth are the same in the N-type emitter regions 3 and in N-type sense regions 5, and the emitter regions 3 and the sense regions 5 are located so as to be aligned in the second direction perpendicular to the first direction going from the collector region 7 toward the base region 2. Furthermore, as a characteristic of this embodiment as in the first embodiment, the ratio of the width 12 of parts of the base region 2 that are adjacent to the N-type sense regions 5 to the width 11 of the sense regions 5 in the second direction is set equal to the ratio of the width 14 of parts of the base region 2 that are adjacent to the N-type emitter regions 3 to the width 13 of the emitter regions 3 in the second direction. Specifically, the sense regions 5, the emitter regions 3, the parts of the base region 2 that are adjacent to the sense regions 5, and the parts of the base region 2 that are adjacent to the emitter regions 3 all have the same width in the second direction.

That is, in this embodiment as in the first embodiment, since the ratio of the width 12 of the parts of the base region 2 that are adjacent to the N-type sense regions 5 to the width 11 of the sense regions 5 in the second direction is set equal to the ratio of the width 14 of the parts of the base region 2 that are adjacent to the N-type emitter regions 3 to the width 13 of the emitter regions 3 in the second direction, the amount of electrons emitted from the N-type sense regions 5 per unit width in the second direction is equal to the amount of electrons emitted from the N-type emitter regions 3 per unit width in the second direction. Hence, a sense ratio, which is the ratio of a collector current to a sense current, is kept constant irrespective of the magnitude of the collector current. In the high-voltage semiconductor switching element composed of the lateral IGBT, therefore, the collector current dependence of the sense ratio is controllable by the configuration of the switching element itself.

In the hybrid IGBT 40 of this embodiment, the N-type sense regions 5 and the P-type collector region 7 are located so as to face each other with a gate electrode 10 interposed therebetween, thereby producing the following effect.

When the hybrid IGBT 40 performs the MISFET operation, an equal amount of electrons flow from each of the sense regions 5 and the emitter regions 3 to the drain regions 15. On the other hand, when the hybrid IGBT 40 performs the IGBT operation, the current density of electron currents emitted from emitter regions 3 and sense regions 5 located facing the collector region 7 is greater than that of electron currents emitted from emitter regions 3 and sense regions 5 located facing the drain regions 15. This is because when the hybrid IGBT 40 performs the IGBT operation, holes emitted from the collector region 7 occupy most of the collector current. As a result, the amount of electrons (i.e., the magnitude of a sense current) emitted from the sense regions 5 for recombination with the holes emitted from the collector region 7 becomes larger in the sense regions 5 located facing the collector region 7 than in the sense regions 5 located facing the drain regions 15.

Therefore, as in this embodiment, if the N-type sense regions 5 and the P-type collector region 7 are located so as to face each other with the gate electrode 10 interposed therebetween, the difference between a sense ratio obtained when the hybrid IGBT 40 performs the MISFET operation and that obtained when the hybrid IGBT 40 performs the IGBT operation is decreased. In other words, the difference between the sense ratios under light load and under heavy load is decreased. This produces the effect that the hybrid IGBT is controlled easily.

In this embodiment, the sense regions 5, the emitter regions 3, the parts of the base region 2 adjacent to the sense regions 5, and the parts of the base region 2 adjacent to the emitter regions 3 all have the same width in the second direction. Nevertheless, the width of each region is not particularly limited to a specific value, so long as the ratio of the width 12 of the parts of the base region 2 that are adjacent to the N-type sense regions 5 to the width 11 of the sense regions 5 in the second direction can be set equal to the ratio of the width 14 of the parts of the base region 2 that are adjacent to the N-type emitter regions 3 to the width 13 of the emitter regions 3 in the second direction.

Moreover, in this embodiment, a heavily doped P-type base contact region may be formed in the base region 2 in such a manner as to be adjacent to the emitter regions 3 and the sense regions 5.

Third Embodiment

A high-voltage semiconductor switching element according to a third embodiment of the invention will be described with reference to the accompanying drawings.

FIG. 4A is a plan view of the high-voltage semiconductor switching element, specifically, a hybrid IGBT 40, according to the third embodiment of the invention. FIGS. 4B to 4D are cross-sectional views taken along the lines A-A', B-B', and C-C' in FIG. 4A, respectively. In the hybrid IGBT 40 illustrated in FIGS. 4A to 4D, the same members as those of the IGBT 30 of the first embodiment shown in FIGS. 1A to 1C or as those of the IGBT 40 of the second embodiment shown in FIGS. 3A to 3D are identified by the same reference numerals, and duplicated descriptions will be thus omitted herein.

The IGBT 40 of this embodiment differs from the IGBT 40 of the second embodiment in the following respect: in the IGBT 40 of the second embodiment, the N-type sense regions 5 and the P-type collector region 7 are located so as to face each other with the gate electrode 10 interposed therebetween, while in the IGBT 40 of this embodiment, N-type sense regions 5 and an N-type drain region 15 are located so as to face each other with a gate electrode 10 interposed therebetween.

This enables the IGBT 40 of this embodiment to produce the following effect in addition to the effect obtainable by the IGBT 40 of the second embodiment. To be specific, when the hybrid IGBT 40 of this embodiment performs the IGBT operation, the current density of electron currents emitted from the sense regions 5 located so as to face the drain region 15 is smaller than that of electron currents emitted from emitter regions 3 located so as to face collector regions 7. This allows a sense ratio, which is the ratio of a collector current to a sense current, to be increased. Consequently, as compared with the case (i.e., the second embodiment) in which the N-type sense regions 5 and the P-type collector region 7 are located so as to face each other with the gate electrode 10 interposed therebetween, more sense regions 5 can be provided even when the hybrid IGBT is controlled with a collector current of the same magnitude, thereby producing the effect of reducing variations in the sense current.

Fourth Embodiment

A high-voltage semiconductor switching element according to a fourth embodiment of the invention will be described with reference to the accompanying drawings.

FIG. 5A is a plan view of the high-voltage semiconductor switching element, specifically, a hybrid IGBT 40, according to the fourth embodiment of the invention. FIGS. 5B to 5E are cross-sectional views taken along the lines A-A', B-B', C-C', and D-D' in FIG. 5A, respectively. In the hybrid IGBT 40 illustrated in FIGS. 5A to 5E, the same members as those of the IGBT 30 of the first embodiment shown in FIGS. 1A to 1C or as those of the IGBT 40 of the second or third embodiment shown in FIGS. 3A to 3D or in FIGS. 4A to 4D are identified by the same reference numerals, and duplicated descriptions will be thus omitted herein.

The IGBT 40 of this embodiment differs from the IGBT 40 of the second embodiment in the following respect: in the IGBT 40 of the second embodiment, the N-type sense regions 5 and the P-type collector region 7 are located so as to face each other with the gate electrode 10 interposed therebetween, while in the IGBT 40 of this embodiment, at least one N-type sense region 5 and a P-type collector region 7 are located so as to face each other with a gate electrode 10 interposed therebetween, and the other N-type sense regions 5 and an N-type drain region 15 are located so as to face each other with the gate electrode 10 interposed therebetween.

Then, the IGBT 40 of this embodiment produces the following effect in addition to the effect obtainable by the IGBT 40 of the second embodiment. To be specific, as compared with the case (i.e., the third embodiment) in which all of the sense regions 5 are located so as to face the drain region 15, the difference between a sense ratio obtained when the MISFET operation is performed and that obtained when the IGBT operation is performed is decreased, thereby producing the effect that the hybrid IGBT is easily controlled. In addition, as compared with the case (i.e., the second embodiment) in which all of the sense regions 5 are located so as to face the collector region 7, the sense ratio, i.e., the ratio of a collector current to a sense current, obtained when the IGBT operation is performed is increased, so that more sense regions 5 can be provided, thereby producing the effect of reducing variations in the sense current.

Figure 6:
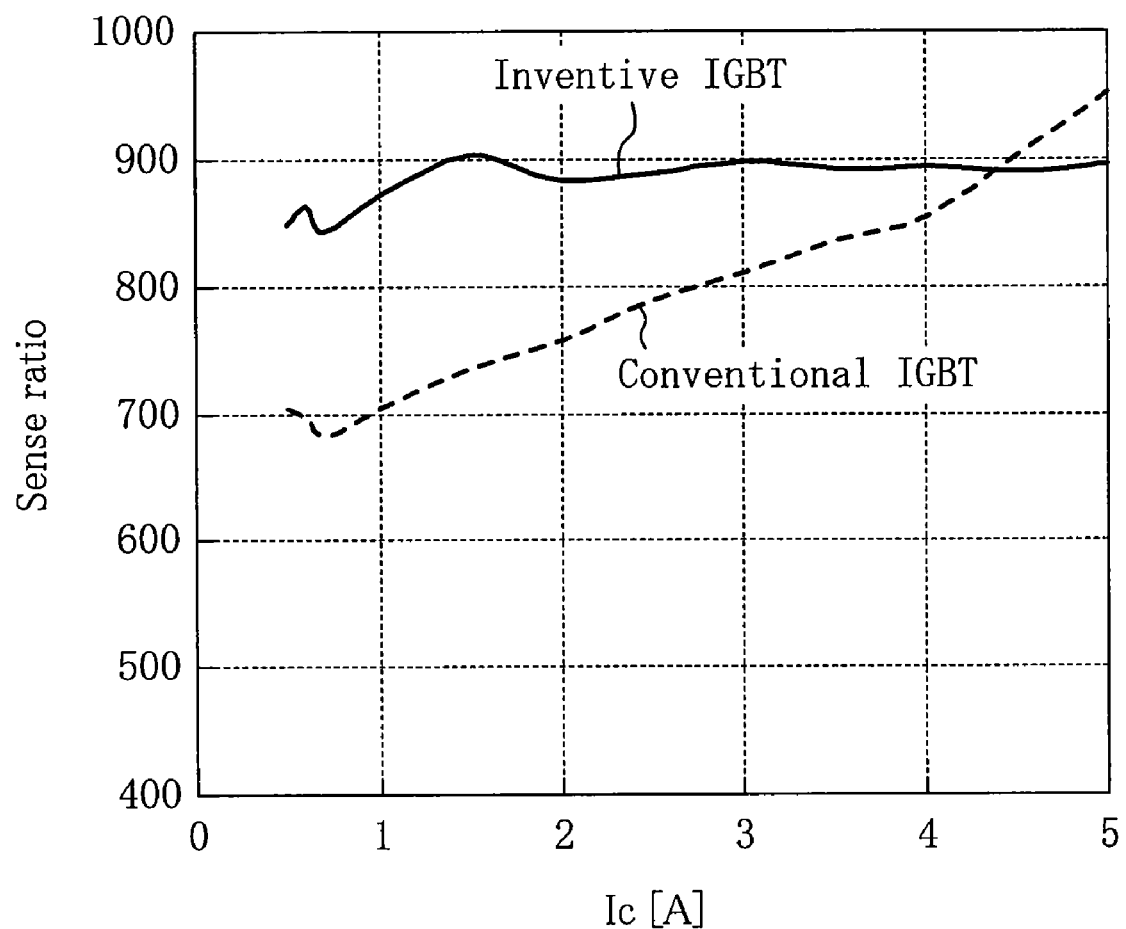
FIG. 6 shows, for comparison purposes, the relation between a collector current and a sense ratio in the high-voltage semiconductor switching element according to the fourth embodiment of the invention and in a conventional example, when the collector current Ic becomes saturated at 6 A.

FIG. 6 shows the relation between a collector current and a sense ratio in hybrid IGBTs in which the collector current Ic becomes saturated at 6 A. In FIG. 6, the solid line indicates the relation between a collector current and a sense ratio in the hybrid IGBT of this embodiment, while a dashed line indicates the relation between a collector current and a sense ratio in a conventional hybrid IGBT. As shown in FIG. 6, in the conventional hybrid IGBT, the sense ratio increases from 700 to 950 in a range from 0.5 A to 5 A that correspond to 8% and 80% of the saturation collector current, respectively, while in the hybrid IGBT of this embodiment, the sense ratio is kept constant at a value of approximately 900 in the same range.

Fifth Embodiment

A high-voltage semiconductor switching element according to a fifth embodiment of the invention will be described with reference to the accompanying drawings.

Figure 7B:
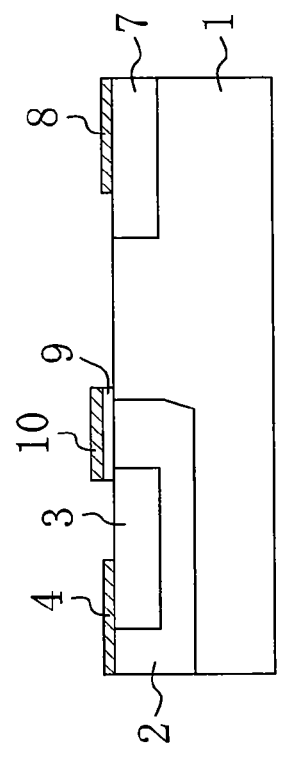
FIGS. 7B and 7C are cross-sectional views taken along the lines A-A' and B-B' in FIG. 7A, respectively.
Figure 7C:
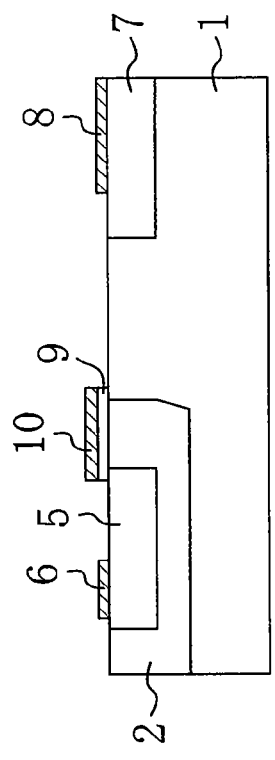
Figure 7A:
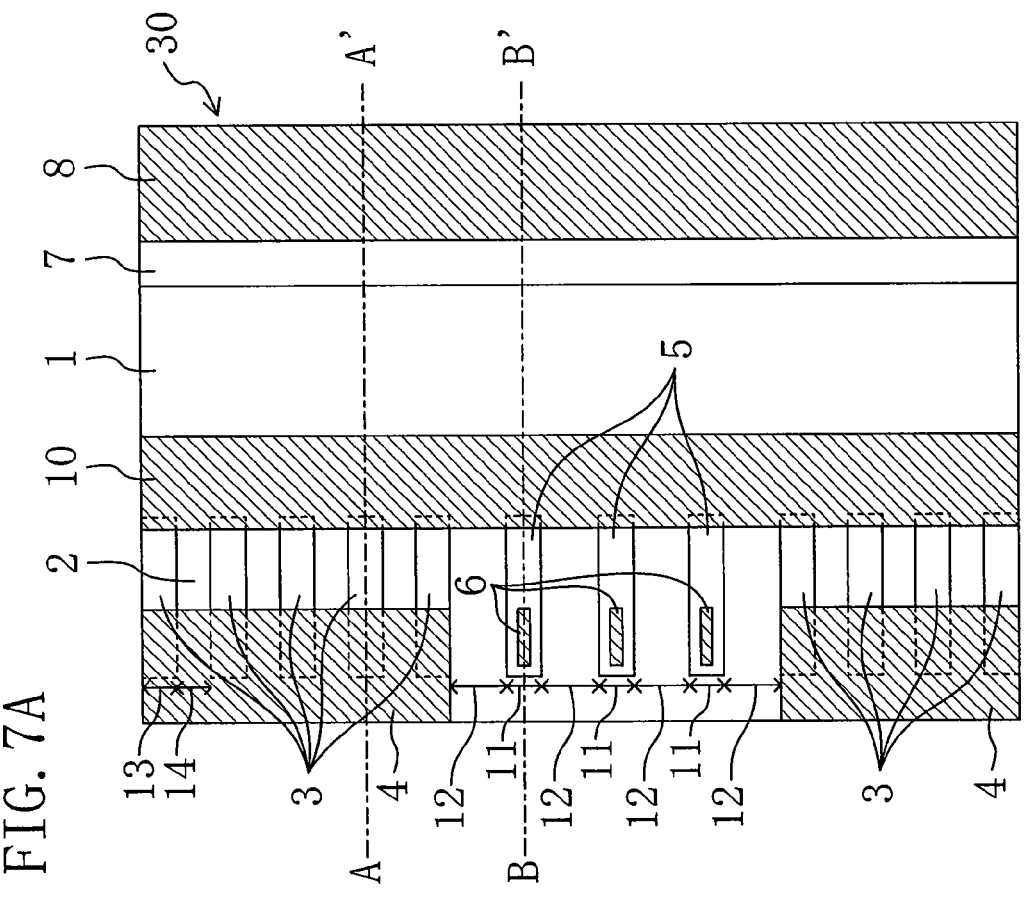
FIG. 7A is a plan view of a high-voltage semiconductor switching element according to a fifth embodiment of the invention.

FIG. 7A is a plan view of the high-voltage semiconductor switching element, specifically, an IGBT 30, according to the fifth embodiment of the invention. FIGS. 7B and 7C are cross-sectional views taken along the lines A-A' and B-B' in FIG. 7A, respectively. In the IGBT 30 illustrated in FIGS. 7A to 7C, the same members as those of the IGBT 30 of the first embodiment shown in FIGS. 1A to 1C are identified by the same reference numerals, and duplicated descriptions will be thus omitted herein.

The IGBT 30 of this embodiment differs from the IGBT 30 of the first embodiment illustrated in FIGS. 1A to 1C in the following respect: assuming that the direction going from a collector region 7 toward a base region 2 is a first direction and that the direction perpendicular to the first direction is a second direction, the ratio of the width 12 of parts of the base region 2 that are adjacent to N-type sense regions 5 to the width 11 of the sense regions 5 in the second direction is set greater than the ratio of the width 14 of parts of the base region 2 that are adjacent to N-type emitter regions 3 to the width 13 of the emitter regions 3 in the second direction. Specifically, the sense regions 5, the emitter regions 3, and the parts of the base region 2 adjacent to the emitter regions 3 all have the same width in the second direction, while the width 12 of the parts of the base region 2 adjacent to the sense regions 5 is set greater than the width 14 of the parts of the base region 2 adjacent to the emitter regions 3.

The IGBT according to the fifth embodiment operates in the following manner.

In the IGBT 30 of this embodiment illustrated in FIGS. 7A to 7C, the amount of electrons emitted from the N-type sense regions 5 is expressed as the sum of the amount of holes emitted from parts of the P-type collector region 7 that face the N-type sense regions 5 and the amount of holes emitted from parts of the P-type collector region 7 that face the parts of the P-type base region 2 adjacent to the N-type sense regions 5. Also, the amount of electrons emitted from the N-type emitter regions 3 is expressed as the sum of the amount of holes emitted from parts of the P-type collector region 7 that face the N-type emitter regions 3 and the amount of holes emitted from parts of the P-type collector region 7 that face the parts of the P-type base region 2 adjacent to the N-type emitter regions 3. In this embodiment, the ratio of the width 12 of the parts of the P-type base region 2 that are adjacent to the N-type sense regions 5 to the width 11 of the sense regions 5 is greater than the ratio of the width 14 of the parts of the P-type base region 2 that are adjacent to the N-type emitter regions 3 to the width 13 of the emitter regions 3. Therefore, the amount of electrons emitted from the N-type sense regions 5 per unit width in the second direction is greater than the amount of electrons emitted from the N-type emitter regions 3 per unit width in the second direction, resulting in a smaller sense ratio as compared with the first embodiment. On the other hand, the saturation current value of the sense current emitted from the N-type sense regions 5 per unit width in the second direction is equal to the saturation current value of the source current emitted from the N-type emitter regions 3 per unit width in the second direction. Thus, as the collector current is increased, the source current and the sense current are also increased, but the increase in the sense current per unit width with respect to the increase in the collector current gradually becomes smaller than the increase in the source current per unit width with respect to the increase in the collector current. That is, in this embodiment, as the collector current is increased, the sense ratio is increased.

As described above, in this embodiment, a high-voltage semiconductor switching element (i.e., the IGBT 30) is achieved in which as the collector current is increased, the sense ratio is increased. In other words, in this embodiment, it is also possible to control the collector current dependence of the sense ratio by the configuration of the switching element itself.

Also, in this embodiment, the sense regions 5, the emitter regions 3, and the parts of the base region 2 adjacent to the emitter regions 3 all have the same width in the second direction, while the width 12 of the parts of the base region 2 that are adjacent to the sense regions 5 is set greater than the width 14 of the parts of the base region 2 that are adjacent to the emitter regions 3. However, the width of each region is not particularly limited to a specific value, so long as the ratio of the width 12 of the parts of the base region 2 that are adjacent to the N-type sense regions 5 to the width 11 of the sense regions 5 in the second direction can be set greater than the ratio of the width 14 of the parts of the base region 2 that are adjacent to the N-type emitter regions 3 to the width 13 of the emitter regions 3 in the second direction.

Furthermore, in this embodiment, a heavily doped P-type base contact region may be formed in the base region 2 in such a manner as to be adjacent to the emitter regions 3 and the sense regions 5.

Sixth Embodiment

A high-voltage semiconductor switching element according to a sixth embodiment of the invention will be described with reference to the accompanying drawings.

FIG. 8A is a plan view of the high-voltage semiconductor switching element, specifically, an IGBT 30, according to the sixth embodiment of the invention. FIGS. 8B and 8C are cross-sectional views taken along the lines A-A' and B-B' in FIG. 8A, respectively. In the IGBT 30 illustrated in FIGS. 8A to 8C, the same members as those of the IGBT 30 shown in FIGS. 1A to 1C are identified by the same reference numerals, and duplicated descriptions will be thus omitted herein.

The IGBT 30 of this embodiment differs from the IGBT 30 of the first embodiment illustrated in FIGS. 1A to 1C in the following respect: assuming that the direction going from a collector region 7 toward a base region 2 is a first direction and that the direction perpendicular to the first direction is a second direction, the ratio of the width 12 of parts of the base region 2 that are adjacent to N-type sense regions 5 to the width 11 of the sense regions 5 in the second direction is set smaller than the ratio of the width 14 of parts of the base region 2 that are adjacent to N-type emitter regions 3 to the width 13 of the emitter regions 3 in the second direction. Specifically, the sense regions 5, the emitter regions 3, and the parts of the base region 2 adjacent to the emitter regions 3 all have the same width in the second direction, while the width 12 of the parts of the base region 2 adjacent to the sense regions 5 is set smaller than the width 14 of the parts of the base region 2 adjacent to the emitter regions 3.

In the IGBT 30 of this embodiment illustrated in FIGS. 8A to 8C as opposed to the IGBT of the fifth embodiment, the ratio of the width 12 of the parts of the P-type base region 2 that are adjacent to the N-type sense regions 5 to the width 11 of the sense regions 5 is set smaller than the ratio of the width 14 of the parts of the P-type base region 2 that are adjacent to the N-type emitter regions 3 to the width 13 of the emitter regions 3. Therefore, the amount of electrons emitted from the N-type sense regions 5 per unit width in the second direction becomes smaller than the amount of electrons emitted from the N-type emitter regions 3 per unit width in the second direction, resulting in a greater sense ratio as compared with the first embodiment. On the other hand, the saturation current value of the sense current emitted from the N-type sense regions 5 per unit width in the second direction is equal to the saturation current value of the source current emitted from the N-type emitter regions 3 per unit width in the second direction. Thus, as the collector current is increased, the source current and the sense current are also increased, but the increase in the sense current per unit width with respect to the increase in the collector current gradually becomes greater than the increase in the source current per unit width with respect to the increase in the collector current. That is, in this embodiment, as the collector current is increased, the sense ratio is decreased As described above, in this embodiment, a high-voltage semiconductor switching element (i.e., the IGBT 30) is achieved in which as the collector current is increased, the sense ratio is decreased. In other words, in this embodiment, it is also possible to control the collector current dependence of the sense ratio by the configuration of the switching element itself.

Also, in this embodiment, the sense regions 5, the emitter regions 3, and the parts of the base region 2 adjacent to the emitter regions 3 all have the same width in the second direction, while the width 12 of the parts of the base region 2 adjacent to the sense regions 5 is set smaller than the width 14 of the parts of the base region 2 adjacent to the emitter regions 3. However, the width of each region is not particularly limited to a specific value, so long as the ratio of the width 12 of the parts of the base region 2 that are adjacent to the N-type sense regions 5 to the width 11 of the sense regions 5 in the second direction can be set smaller than the ratio of the width 14 of the parts of the base region 2 that are adjacent to the N-type emitter regions 3 to the width 13 of the emitter regions 3 in the second direction.

Furthermore, in this embodiment, a heavily doped P-type base contact region may be formed in the base region 2 in such a manner as to be adjacent to the emitter regions 3 and the sense regions 5.

Seventh Embodiment

A high-voltage semiconductor switching element according to a seventh embodiment of the invention will be described with reference to the accompanying drawings.

Figure 9B:
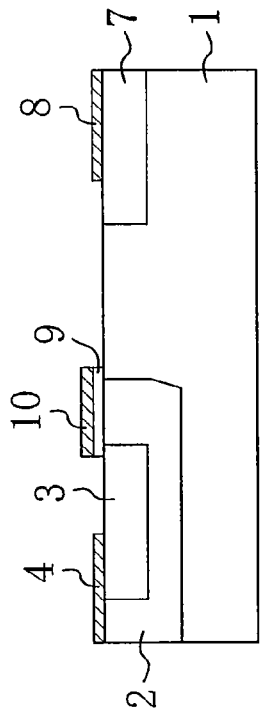
FIGS. 9B to 9D are cross-sectional views taken along the lines A-A', B-B', and C-C' in FIG. 9A, respectively.
Figure 9C:
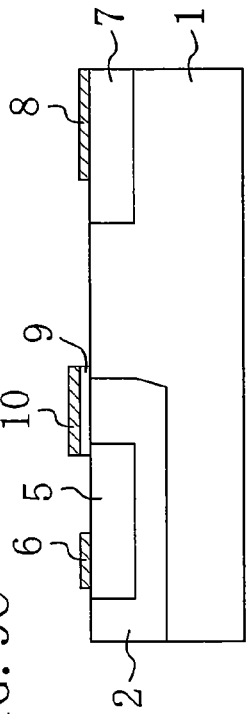
Figure 9D:
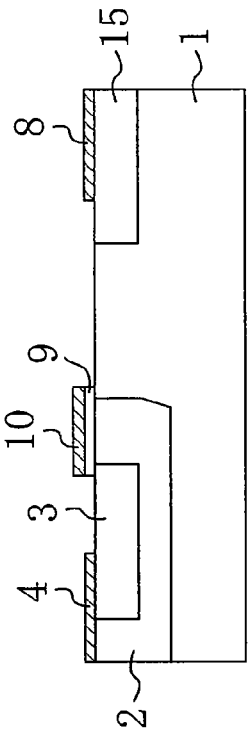
Figure 9A:
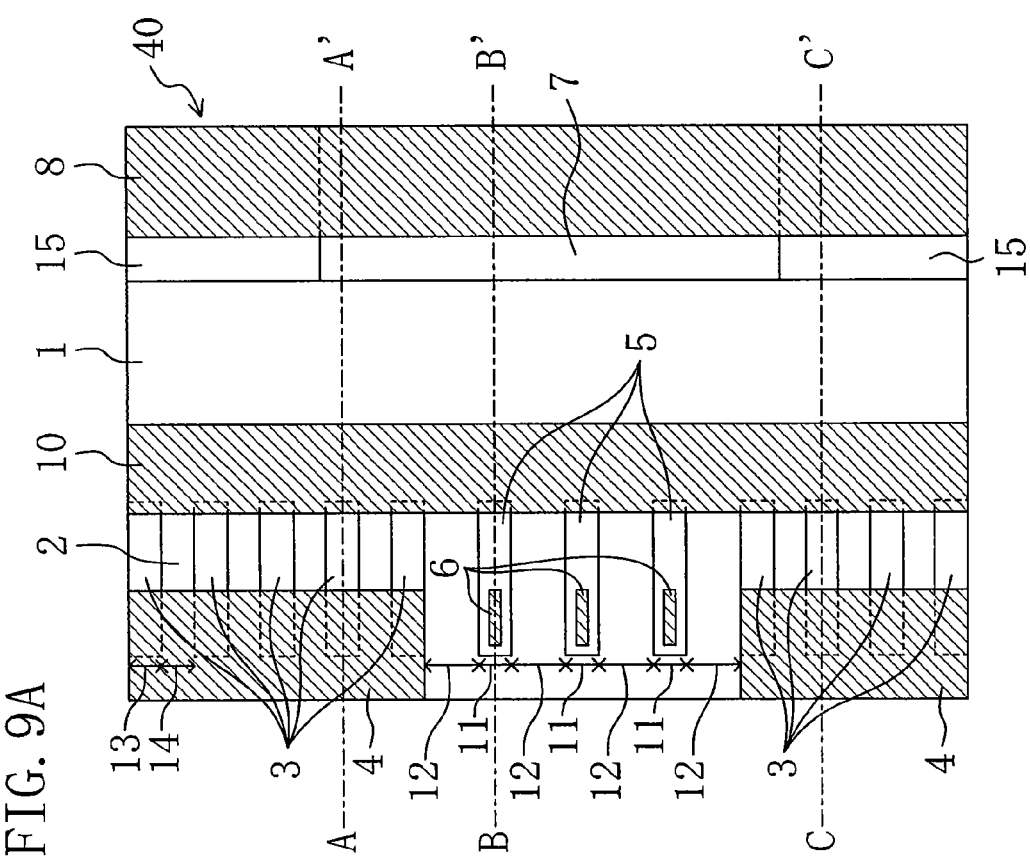
FIG. 9A is a plan view of a high-voltage semiconductor switching element according to a seventh embodiment of the invention.

FIG. 9A is a plan view of the high-voltage semiconductor switching element, specifically, a hybrid IGBT 40, according to the seventh embodiment of the invention. FIGS. 9B to 9D are cross-sectional views taken along the lines A-A', B-B', and C-C' in FIG. 9A, respectively. In the hybrid IGBT 40 illustrated in FIGS. 9A to 9D, the same members as those of the IGBT 30 of the first embodiment shown in FIGS. 1A to 1C or as those of the IGBT 40 of the second embodiment shown in FIGS. 3A to 3D are identified by the same reference numerals, and duplicated descriptions will be thus omitted herein.

The IGBT 40 of this embodiment differs from the IGBT 40 of the second embodiment as follows. In the IGBT 40 of the second embodiment, assuming that the direction going from the collector region 7 toward the base region 2 is a first direction and that the direction perpendicular to the first direction is a second direction, the ratio of the width 12 of the parts of the base region 2 that are adjacent to the N-type sense regions 5 to the width 11 of the sense regions 5 in the second direction is set equal to the ratio of the width 14 of the parts of the base region 2 that are adjacent to the N-type emitter regions 3 to the width 13 of the emitter regions 3 in the second direction. On the other hand, in the IGBT 40 of this embodiment as in the IGBT 30 of the fifth embodiment illustrated in FIGS. 7A to 7C, the ratio of the width 12 of parts of a base region 2 that are adjacent to N-type sense regions 5 to the width 11 of the sense regions 5 in the second direction is set greater than the ratio of the width 14 of parts of the base region 2 that are adjacent to N-type emitter regions 3 to the width 13 of the emitter regions 3 in the second direction. Specifically, the sense regions 5, the emitter regions 3, and the parts of the base region 2 adjacent to the emitter regions 3 all have the same width in the second direction, while the width 12 of the parts of the base region 2 adjacent to the sense regions 5 is set greater than the width 14 of the parts of the base region 2 adjacent to the emitter regions 3.

Accordingly, in the hybrid IGBT 40 of this embodiment as in the IGBT 30 of the fifth embodiment, a high-voltage semiconductor switching element is achieved in which as the collector current is increased, the sense ratio is increased. In other words, in this embodiment, it is also possible to control the collector current dependence of the sense ratio by the configuration of the switching element itself.

Also, in this embodiment, the sense regions 5, the emitter regions 3, and the parts of the base region 2 adjacent to the emitter regions 3 all have the same width in the second direction, while the width 12 of the parts of the base region 2 that are adjacent to the sense regions 5 is set greater than the width 14 of the parts of the base region 2 that are adjacent to the emitter regions 3. However, the width of each region is not particularly limited to a specific value, so long as the ratio of the width 12 of the parts of the base region 2 adjacent to the N-type sense regions 5 to the width 11 of the sense regions 5 in the second direction can be set greater than the ratio of the width 14 of the parts of the base region 2 that are adjacent to the N-type emitter regions 3 to the width 13 of the emitter regions 3 in the second direction.

Furthermore, in this embodiment, a heavily doped P-type base contact region may be formed in the base region 2 in such a manner as to be adjacent to the emitter regions 3 and the sense regions 5.

Moreover, in this embodiment as in the second embodiment, if the N-type sense regions 5 and a P-type collector region 7 are located so as to face each other with a gate electrode 10 interposed therebetween, the difference between a sense ratio obtained when the MISFET operation is performed and that obtained when the IGBT operation is performed is reduced, thereby producing the effect that the hybrid IGBT 40 is easily controlled.

Furthermore, in this embodiment as in the third embodiment, if the N-type sense regions 5 and an N-type drain region 15 are located so as to face each other with a gate electrode 10 interposed therebetween, the sense ratio, i.e., the ratio of a collector current to a sense current, obtained when the IGBT operation is performed is increased. This allows more sense regions 5 to be provided, thereby producing the effect of reducing variations in the sense current.

Also, in this embodiment as in the fourth embodiment, if at least one N-type sense region 5 and a P-type collector region 7 are located so as to face each other with a gate electrode 10 interposed therebetween, and the other N-type sense regions 5 and an N-type drain region 15 are located so as to face each other with the gate electrode 10 interposed therebetween, the following effect is obtainable. Specifically, as compared with the case in which all of the sense regions 5 are located so as to face the drain region 15, the difference between the sense ratio obtained when the MISFET operation is performed and that obtained when the IGBT operation is performed is reduced, thereby producing the effect that the hybrid IGBT 40 is controlled easily. In addition, as compared with the case in which all of the sense regions 5 are located so as to face the collector region 7, the sense ratio obtained when the IGBT operation is performed is increased, so that more sense regions 5 can be provided, thereby producing the effect of reducing variations in the sense current.

Eighth Embodiment

A high-voltage semiconductor switching element according to an eighth embodiment of the invention will be described with reference to the accompanying drawings.

Figure 10B:
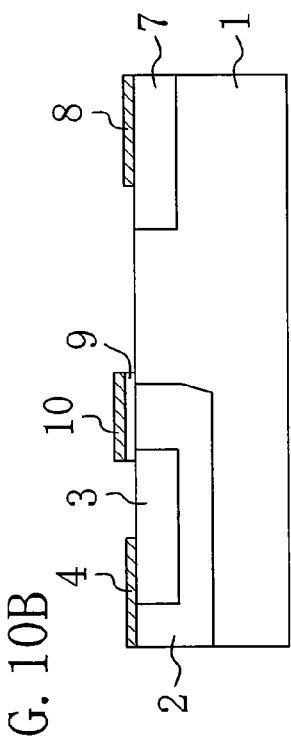
FIGS. 10B to 10D are cross-sectional views taken along the lines A-A', B-B', and C-C' in FIG. 10A, respectively.
Figure 10C:
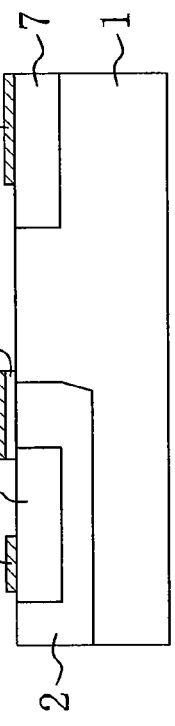
Figure 10D:
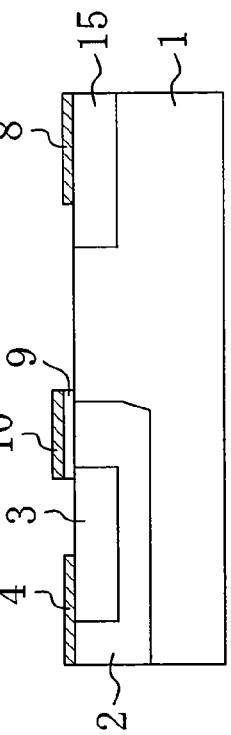
Figure 10A:
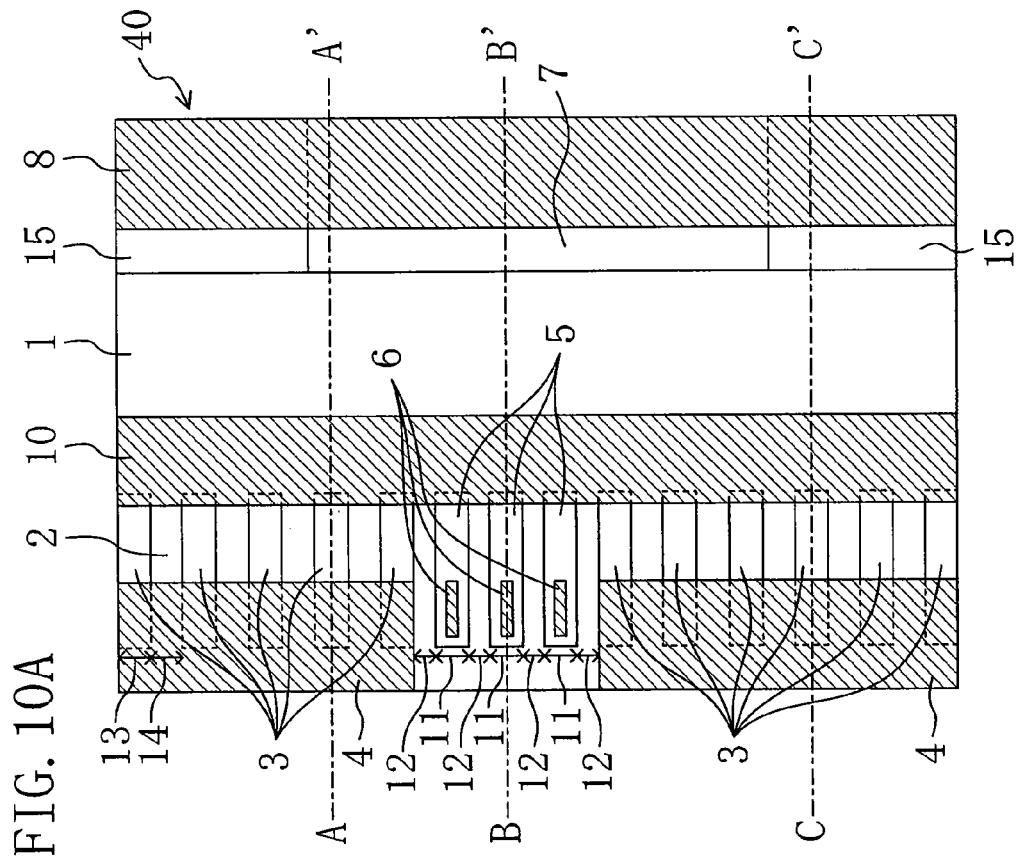
FIG. 10A is a plan view of a high-voltage semiconductor switching element according to an eighth embodiment of the invention.

FIG. 10A is a plan view of the high-voltage semiconductor switching element, specifically, a hybrid IGBT 40, according to the eighth embodiment of the invention. FIGS. 10B to 10D are cross-sectional views taken along the lines A-A', B-B', and C-C' in FIG. 10A, respectively. In the hybrid IGBT 40 illustrated in FIGS. 10A to 10D, the same members as those of the IGBT 30 of the first embodiment shown in FIGS. 1A to 1C or as those of the IGBT 40 of the second embodiment shown in FIGS. 3A to 3D are identified by the same reference numerals, and duplicated descriptions will be thus omitted herein.

The IGBT 40 of this embodiment differs from the IGBT 40 of the second embodiment as follows. In the IGBT 40 of the second embodiment, assuming that the direction going from the collector region 7 toward the base region 2 is a first direction and that the direction perpendicular to the first direction is a second direction, the ratio of the width 12 of the parts of the base region 2 that are adjacent to the N-type sense regions 5 to the width 11 of the sense regions 5 in the second direction is set equal to the ratio of the width 14 of the parts of the base region 2 that are adjacent to the N-type emitter regions 3 to the width 13 of the emitter regions 3 in the second direction. On the other hand, in the IGBT 40 of this embodiment as in the IGBT 30 of the sixth embodiment illustrated in FIGS. 8A to 8C, the ratio of the width 12 of parts of a base region 2 that are adjacent to N-type sense regions 5 to the width 11 of the sense regions 5 in the second direction is set smaller than the ratio of the width 14 of parts of the base region 2 that are adjacent to N-type emitter regions 3 to the width 13 of the emitter regions 3 in the second direction. Specifically, the sense regions 5, the emitter regions 3, and the parts of the base region 2 adjacent to the emitter regions 3 all have the same width in the second direction, while the width 12 of the parts of the base region 2 that are adjacent to the sense regions 5 is set smaller than the width 14 of the parts of the base region 2 that are adjacent to the emitter regions 3.

Accordingly, in the hybrid IGBT 40 of this embodiment as in the IGBT 30 of the sixth embodiment, a high-voltage semiconductor switching element is achieved in which as the collector current is increased, the sense ratio is decreased. In other words, in this embodiment, it is also possible to control the collector current dependence of the sense ratio by the configuration of the switching element itself.

In this embodiment, the sense regions 5, the emitter regions 3, and the parts of the base region 2 adjacent to the emitter regions 3 all have the same width in the second direction, while the width 12 of the parts of the base region 2 that are adjacent to the sense regions 5 is set smaller than the width 14 of the parts of the base region 2 that are adjacent to the emitter regions 3. Nevertheless, the width of each region is not particularly limited to a specific value, so long as the ratio of the width 12 of the parts of the base region 2 that are adjacent to the N-type sense regions 5 to the width 11 of the sense regions 5 in the second direction can be set smaller than the ratio of the width 14 of the parts of the base region 2 that are adjacent to the N-type emitter regions 3 to the width 13 of the emitter regions 3 in the second direction.

Moreover, in this embodiment, a heavily doped P-type base contact region may be formed in the base region 2 in such a manner as to be adjacent to the emitter regions 3 and the sense regions 5.

Furthermore, in this embodiment as in the second embodiment, if the N-type sense regions 5 and a P-type collector region 7 are located so as to face each other with a gate electrode 10 interposed therebetween, the difference between a sense ratio obtained when the MISFET operation is performed and that obtained when the IGBT operation is performed is reduced, thereby producing the effect that the hybrid IGBT 40 is easily controlled.

Also, in this embodiment as in the third embodiment, if the N-type sense regions 5 and an N-type drain region 15 are located so as to face each other with a gate electrode 10 interposed therebetween, the sense ratio, i.e., the ratio of a collector current to a sense current, obtained when the IGBT operation is performed is increased. This allows more sense regions 5 to be provided, thereby producing the effect of reducing variations in the sense current.

Furthermore, in this embodiment as in the fourth embodiment, if at least one N-type sense region 5 and a P-type collector region 7 are located so as to face each other with a gate electrode 10 interposed therebetween, and the other N-type sense regions 5 and an N-type drain region 15 are located so as to face each other with the gate electrode 10 interposed therebetween, the following effect is obtainable. Specifically, as compared with the case in which all of the sense regions 5 are located so as to face the drain region 15, the difference between the sense ratio obtained when the MISFET operation is performed and that obtained when the IGBT operation is performed is reduced, thereby producing the effect that the hybrid IGBT 40 is controlled easily. In addition, as compared with the case in which all of the sense regions 5 are located so as to face the collector region 7, the sense ratio obtained when the IGBT operation is performed is increased, so that more sense regions 5 can be provided, thereby producing the effect of reducing variations in the sense current.

Figure 11:
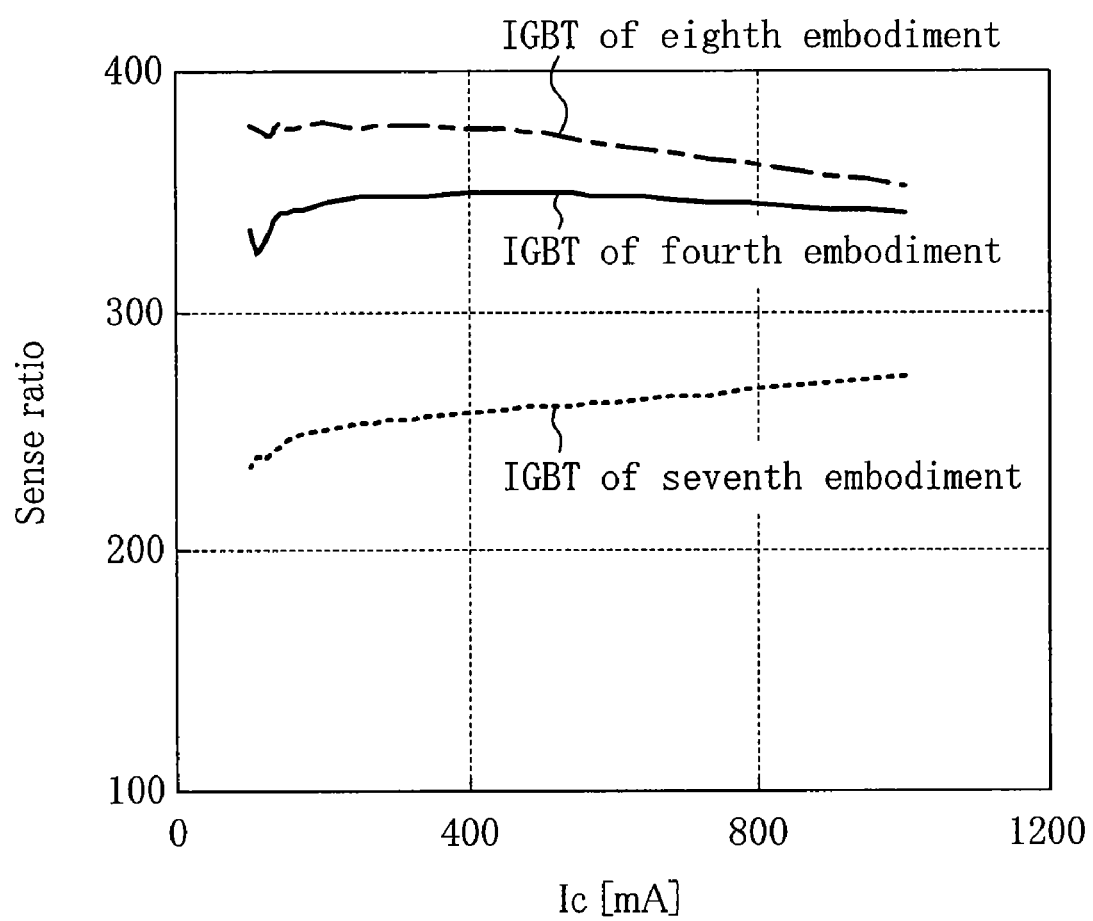
FIG. 11 shows the relation between a collector current and a sense ratio in the high-voltage semiconductor switching elements of the fourth, seventh, and eighth embodiments of the invention, when the collector current Ic becomes saturated at 1.6 A.

FIG. 11 shows the relation between a collector current and a sense ratio in hybrid IGBTs in which the collector current Ic becomes saturated at 1.6 A. To be specific, FIG. 11 shows the relation between a collector current and a sense ratio in the hybrid IGBTs of the above-described fourth and seventh embodiments and of this embodiment.

As shown in FIG. 11, in the hybrid IGBT of the fourth embodiment, the value of the sense ratio is substantially kept constant at approximately 340 regardless of the increase in the collector current. On the other hand, in the hybrid IGBT of the seventh embodiment, as the collector current increases, the sense ratio increases from approximately 240 to approximately 280. In the hybrid IGBT of this embodiment, as the collector current increases, the sense ratio decreases from approximately 380 to approximately 350.

The results in FIG. 11 show that it is possible to change the collector current dependence of the sense ratio in IGBTs and hybrid IGBTs at will by adjusting the widths, in the second direction, of the N-type sense regions 5, of the N-type emitter regions 3, of the parts of the P-type base region 2 that are adjacent to the sense regions 5, and of the parts of the base region 2 that are adjacent to the emitter regions 3. That is, it is found that the collector current dependence of the sense ratio is controllable.

Ninth Embodiment

A high-voltage semiconductor switching element according to a ninth embodiment of the invention will be described with reference to the accompanying drawings.

FIG. 12A is a plan view of the high-voltage semiconductor switching element, specifically, an IGBT 30, according to the ninth embodiment of the invention. FIGS. 12B and 12C are cross-sectional views taken along the lines A-A' and B-B' in FIG. 12A, respectively. In the IGBT 30 illustrated in FIGS. 12A to 12C, the same members as those of the IGBT 30 shown in FIGS. 1A to 1C are identified by the same reference numerals, and duplicated descriptions will be thus omitted herein.

In the IGBT 30 of this embodiment illustrated in FIGS. 12A to 12C as in the IGBT 30 of the first embodiment illustrated in FIGS. 1A to 1C, emitter regions 3 and sense regions 5 are located so as to be aligned in a second direction perpendicular to a first direction going from a collector region 7 toward a base region 2. Also, the width 11 of the sense regions 5, the width 12 of parts of the base region 2 that are adjacent to the sense regions 5, the width 13 of the emitter regions 3, and the width 14 of parts of the base region 2 that are adjacent to the emitter regions 3 are all equal in the second direction. Furthermore, as a characteristic of this embodiment, the length 16 (in the first direction) of part of each N-type emitter region 3 located between a gate electrode 10 and an emitter electrode 4 is set equal to the length 17 (in the first direction) of part of each N-type sense region 5 located between the gate electrode 10 and a sense electrode 6. Consequently, the resistance of the part of each N-type emitter region 3 located between the gate electrode 10 and the emitter electrode 4 is equal to the resistance of the part of each N-type sense region 5 located between the gate electrode 10 and the sense electrode 6.

With the use of the above-described IGBT configuration of this embodiment, when a collector current of such a magnitude as to cause conductivity modulation in the IGBT 30 flows, the current density of electron currents, that is, a source current, flowing from the emitter regions 3 is substantially equal to the current density of electron currents, that is, a sense current, flowing from the sense regions 5. Therefore, even when a collector current of such a magnitude as to cause conductivity modulation in the IGBT 30 flows, variations in the sense ratio are suppressed, thereby enabling the collector current flowing in the IGBT 30 to be controlled easily.

Also, in this embodiment, since the resistance of the part of each emitter region 3 located between the emitter electrode 4 and the gate electrode 10 is equal to the resistance of the part of each sense region 5 located between the sense electrode 6 and the gate electrode 10, it is possible to make an increase in each resistance resulting from an increase in temperature be equal. Thus, the temperature dependence of the sense ratio is eliminated.

That is, according to this embodiment, the collector current dependence and temperature dependence of the sense ratio are controllable by the configuration of the switching element itself.

In this embodiment, the sense regions 5, the emitter regions 3, the parts of the base region 2 adjacent to the sense regions 5, and the parts of the base region 2 adjacent to the emitter regions 3 all have the same width in the second direction. And the length 16 of the part of each emitter region 3 located between the gate electrode 10 and the emitter electrode 4 is set equal to the length 17 of the part of each sense region 5 located between the gate electrode 10 and the sense electrode 6. Nevertheless, the width and length of each region are not particularly limited to specific values, so long as the resistance of the part of each N-type emitter region 3 located between the gate electrode 10 and the emitter electrode 4 can be set equal to the resistance of the part of each N-type sense region 5 located between the gate electrode 10 and the sense electrode 6.

Moreover, in this embodiment, a heavily doped P-type base contact region may be formed in the base region 2 in such a manner as to be adjacent to the emitter regions 3 and the sense regions 5.

Tenth Embodiment

A high-voltage semiconductor switching element according to a tenth embodiment of the invention will be described with reference to the accompanying drawings.

Figure 13A:
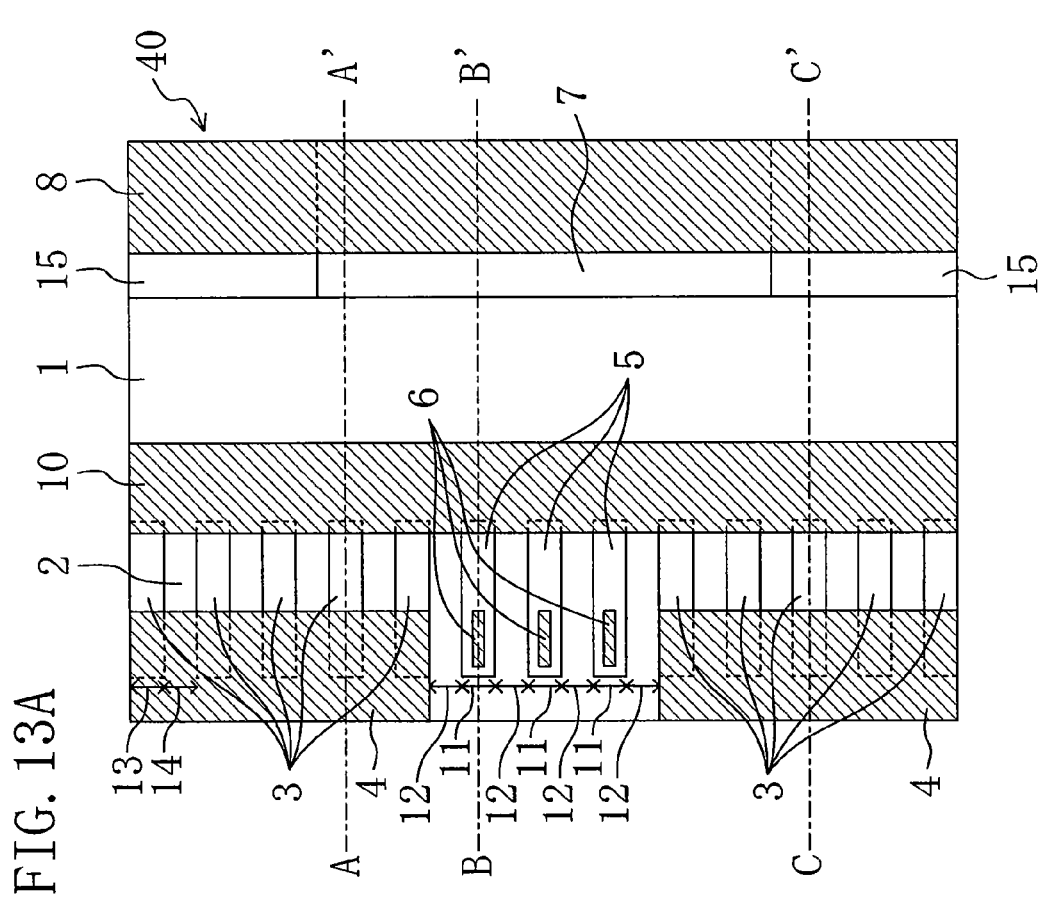
FIG. 13A is a plan view of a high-voltage semiconductor switching element according to a tenth embodiment of the invention.
Figure 13B:
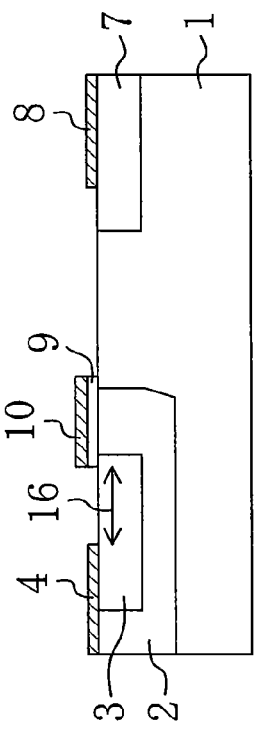
FIGS. 13B to 13D are cross-sectional views taken along the lines A-A', B-B', and C-C' in FIG. 13A, respectively.
Figure 13C:
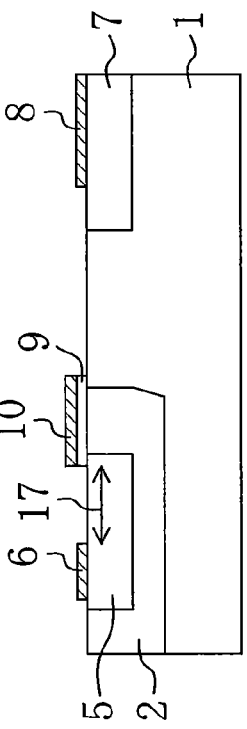
Figure 13D:
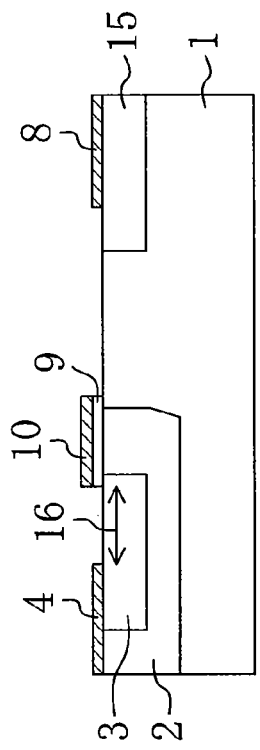

FIG. 13A is a plan view of the high-voltage semiconductor switching element, specifically, a hybrid IGBT 40, according to the tenth embodiment of the invention. FIGS. 13B to 13D are cross-sectional views taken along the lines A-A', B-B', and C-C' in FIG. 13A, respectively. In the hybrid IGBT 40 illustrated in FIGS. 13A to 13D, the same members as those of the IGBT 30 of the first embodiment shown in FIGS. 1A to 1C or as those of the IGBT 40 of the second embodiment shown in FIGS. 3A to 3D are identified by the same reference numerals, and duplicated descriptions will be thus omitted herein.

In the hybrid IGBT 40 of this embodiment illustrated in FIGS. 13A to 13D as in the hybrid IGBT 40 of the second embodiment illustrated in FIGS. 3A to 3D, emitter regions 3 and sense regions 5 are located so as to be aligned in a second direction perpendicular to a first direction going from a collector region 7 toward a base region 2. Also, the width 11 of the sense regions 5, the width 12 of parts of the base region 2 that are adjacent to the sense regions 5, the width 13 of the emitter regions 3, and the width 14 of parts of the base region 2 that are adjacent to the emitter regions 3 are all set equal in the second direction. Furthermore, as a characteristic of this embodiment as in the IGBT 30 of the ninth embodiment illustrated in FIGS. 12A to 12C, the length 16 (in the first direction) of part of each N-type emitter region 3 located between a gate electrode 10 and an emitter electrode 4 is set equal to the length 17 (in the first direction) of part of each N-type sense region 5 located between the gate electrode 10 and a sense electrode 6. Consequently, the resistance of the part of each N-type emitter region 3 located between the gate electrode 10 and the emitter electrode 4 is equal to the resistance of the part of each N-type sense region 5 located between the gate electrode 10 and the sense electrode 6.

With the use of the above-described IGBT configuration of this embodiment, when a collector current of such a magnitude as to cause conductivity modulation in the hybrid IGBT 40 flows, the current density of electron currents, that is, a source current, flowing from the emitter regions 3 is substantially equal to the current density of electron currents, that is, a sense current, flowing from the sense regions 5. Therefore, even when a collector current of such a magnitude as to cause conductivity modulation in the hybrid IGBT 40 flows, variations in the sense ratio are suppressed, thereby enabling the collector current flowing in the hybrid IGBT 40 to be controlled easily.

Also, in this embodiment, since the resistance of the part of each emitter region 3 located between the emitter electrode 4 and the gate electrode 10 is equal to the resistance of the part of each sense region 5 located between the sense electrode 6 and the gate electrode 10, it is possible to make an increase in each resistance resulting from an increase in temperature be equal. Thus, the temperature dependence of the sense ratio is eliminated.

That is, according to this embodiment, the collector current dependence and temperature dependence of the sense ratio are controllable by the configuration of the switching element itself.

In this embodiment, the sense regions 5, the emitter regions 3, the parts of the base region 2 adjacent to the sense regions 5, and the parts of the base region 2 adjacent to the emitter regions 3 all have the same width in the second direction. And the length 16 of the part of each emitter region 3 located between the gate electrode 10 and the emitter electrode 4 is set equal to the length 17 of the part of each sense region 5 located between the gate electrode 10 and the sense electrode 6. Nevertheless, the width and length of each region are not particularly limited to specific values, so long as the resistance of the part of each N-type emitter region 3 located between the gate electrode 10 and the emitter electrode 4 can be set equal to the resistance of the part of each N-type sense region 5 located between the gate electrode 10 and the sense electrode 6.

Moreover, in this embodiment, a heavily doped P-type base contact region may be formed in the base region 2 in such a manner as to be adjacent to the emitter regions 3 and the sense regions 5.

Also, in this embodiment as in the second embodiment, if the N-type sense regions 5 and a P-type collector region 7 are located so as to face each other with the gate electrode 10 interposed therebetween, the difference between a sense ratio obtained when the MISFET operation is performed and that obtained when the IGBT operation is performed is reduced, thereby producing the effect that the hybrid IGBT 40 is easily controlled.

Furthermore, in this embodiment as in the third embodiment, if the N-type sense regions 5 and an N-type drain region 15 are located so as to face each other with a gate electrode 10 interposed therebetween, the sense ratio, i.e., the ratio of a collector current to a sense current, obtained when the IGBT operation is performed is increased. This allows more sense regions 5 to be provided, thereby producing the effect of reducing variations in the sense current.

Also, in this embodiment as in the fourth embodiment, if at least one N-type sense region 5 and a P-type collector region 7 are located so as to face each other with a gate electrode 10 interposed therebetween, and the other N-type sense regions 5 and an N-type drain region 15 are located so as to face each other with the gate electrode 10 interposed therebetween, the following effect is obtainable. Specifically, as compared with the case in which all of the sense regions 5 are located so as to face the drain region 15, the difference between the sense ratio obtained when the MISFET operation is performed and that obtained when the IGBT operation is performed is reduced, thereby producing the effect that the hybrid IGBT 40 is controlled easily. In addition, as compared with the case in which all of the sense regions 5 are located so as to face the collector region 7, the sense ratio obtained when the IGBT operation is performed is increased, so that more sense regions 5 can be provided, thereby producing the effect of reducing variations in the sense current.

First Modified Example of the First Through Tenth Embodiments

The following is a first modified example of the first through tenth embodiments described above.

In the high-voltage semiconductor switching elements according to the first through tenth embodiments, the sense regions 5 are all formed in one or two places. In contrast, in this modified example, sense regions 5 are distributed in two, three or more places, and at least one emitter region 3 is located between the places where at least one of the sense regions 5 is located.

Figure 14B:
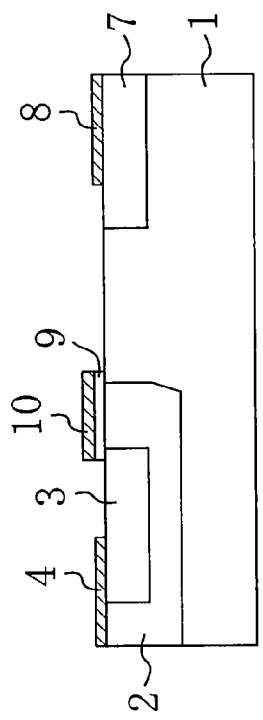
FIGS. 14B and 14C are cross-sectional views taken along the lines A-A' and B-B' in FIG. 14A, respectively.
Figure 14C:
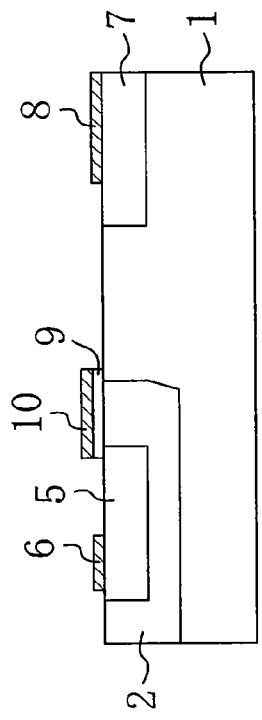
Figure 14A:
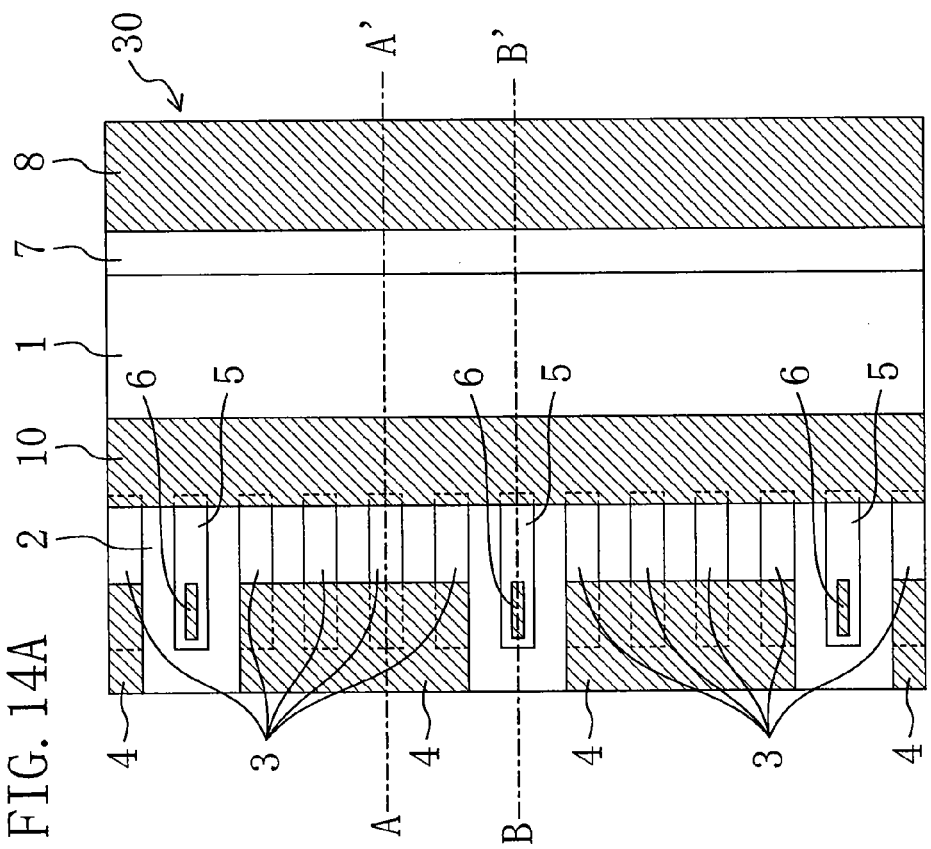
FIG. 14A is a plan view of a high-voltage semiconductor switching element according to a first modified example of the first through tenth embodiments of the invention.

FIG. 14A is a plan view of a high-voltage semiconductor switching element according to this modified example, in which three sense regions 5 are distributed in three places and emitter regions 3 are located between the sense regions 5 in, e.g., the high-voltage semiconductor switching element of the first embodiment illustrated in FIGS. 1A to 1C. FIGS. 14B and 14C are cross-sectional views taken along the lines A-A' and B-B' in FIG. 14A, respectively. In the IGBT 30 illustrated FIGS. 14A to 14C, the same members as those of the IGBT 30 of the first embodiment shown in FIGS. 1A to 1C are identified by the same reference numerals, and duplicated descriptions will be thus omitted herein.

In this modified example, the sense regions 5 are distributed in the multiple places, and therefore, when a collector current of such a magnitude as to cause conductivity modulation in the IGBT 30 flows, the difference between the current density of currents flowing from parts of a collector region 7 that face the sense regions 5 and the current density of currents flowing from parts of the collector region 7 that face the emitter regions 3 is reduced as compared with the cases in which the sense regions 5 are all formed in one place. Consequently, it is possible to reduce variations in the sense ratio caused by variations in the collector current and in temperature, thereby enabling the sense ratio to be kept constant.

That is, in the first to tenth embodiments described above, the effect of suppressing variations in sense ratio is achieved by adopting the configuration of this modified example.

Second Modified Example of the First Through Tenth Embodiments

The following is a second modified example of the first through tenth embodiments described above.

In the high-voltage semiconductor switching elements of the first through tenth embodiments, the P-type collector region or regions 7 are formed in a surface portion or portions of the N-type semiconductor substrate 1 so as to be spaced away from the P-type base region 2. In contrast, in this modified example, a P-type semiconductor substrate is used as a semiconductor substrate, an N-type resurf region is formed in the semiconductor substrate, and a collector region is formed in the resurf region.

Figure 15A:
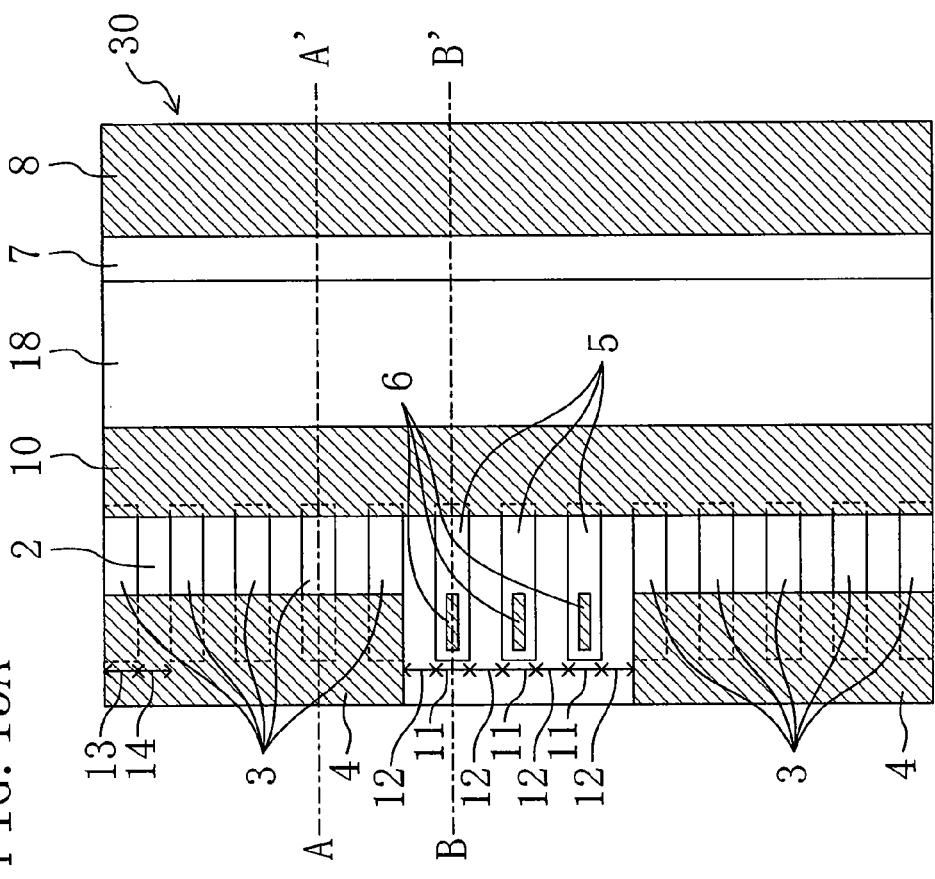
FIG. 15A is a plan view of a high-voltage semiconductor switching element according to a second modified example of the first through tenth embodiments of the invention.
Figure 15B:
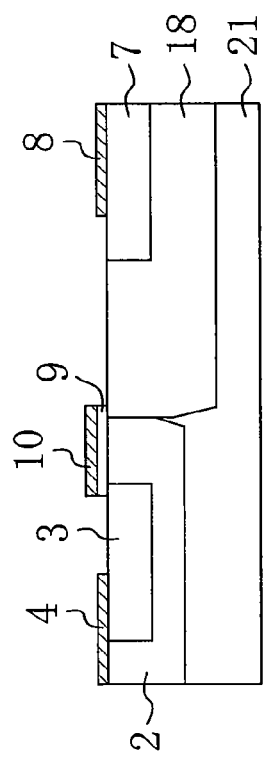
FIGS. 15B and 15C are cross-sectional views taken along the lines A-A' and B-B' in FIG. 15A, respectively.
Figure 15C:
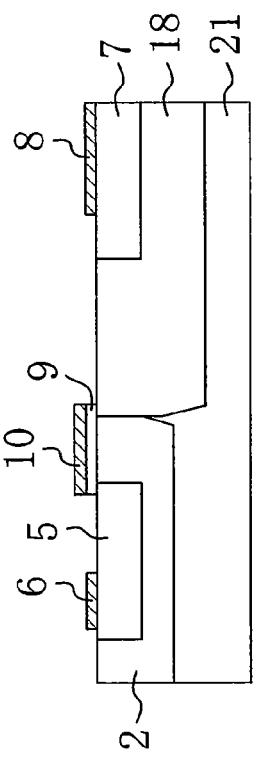

FIG. 15A is a plan view of a high-voltage semiconductor switching element according to this modified example, in which an N-type resurf region 18 is formed in a P-type semiconductor substrate 21 so as to be adjacent to a base region 2, and a P-type collector region 7 is formed in the resurf region 18 in, for example, the high-voltage semiconductor switching element of the first embodiment illustrated in FIGS. 1A to 1C. FIGS. 15B and 15C are cross-sectional views taken along the lines A-A' and B-B' in FIG. 15A, respectively. In the IGBT 30 illustrated in FIGS. 15A to 15C, the same members as those of the IGBT 30 of the first embodiment shown in FIGS. 1A to 1C are identified by the same reference numerals, and duplicated descriptions will be thus omitted herein.

In this modified example, as compared with cases in which an N-type semiconductor substrate is used, current capability in the high-voltage semiconductor switching element, i.e., the IGBT 30, can be increased, because the dopant concentration in the N-type resurf region 18 can be increased. Specifically, since it is possible to shorten the lifetime of minority carriers in the resurf region 18 by increasing the dopant concentration in the resurf region 18, the fall time of a collector current (i.e., the time required for the collector current to be off when the gate is off) is shortened.

When the high-voltage semiconductor switching element is a hybrid IGBT (i.e., in the second to fourth embodiments and in the seventh, eighth, and tenth embodiments), an n-type drain region or regions 15, in addition to the P-type collector region 7, are formed in the N-type resurf region 18 located in a surface portion of the P-type semiconductor substrate 21. This allows the dopant concentration in the N-type resurf region 18 to be increased as compared with cases in which an N-type semiconductor substrate is used, thereby enabling current capability in the high-voltage semiconductor switching element, i.e., the hybrid IGBT, to be increased. Specifically, since it is possible to shorten the lifetime of minority carriers in the resurf region 18 by increasing the dopant concentration in the resurf region 18, the fall time of a collector current (i.e., the time required for the collector current to be off when the gate is off) is shortened. Furthermore, the On resistance during the MISFET operation is reduced by increasing the dopant concentration in the N-type resurf region 18, thereby permitting a greater collector current to flow during the MISFT operation as compared with cases in which an N-type semiconductor substrate is used.

In this manner, in the above-described first through tenth embodiments, if the configuration of this modified example is adopted, it is possible to increase the dopant concentration in the N-type resurf region and thereby increase current capability in the high-voltage semiconductor switching elements.

In this modified example, a P-type top semiconductor layer or a P-type buried semiconductor layer may be formed in the resurf region so as to be spaced away from the collector region, and the top semiconductor layer or the buried semiconductor layer may be electrically connected with the base region. Then, the dopant concentration in the N-type resurf region can be increased further, so that the current capability in the high-voltage semiconductor switching element can be increased further. Alternatively, the top semiconductor layer and the buried semiconductor layer may be both formed.

Figure 16B:
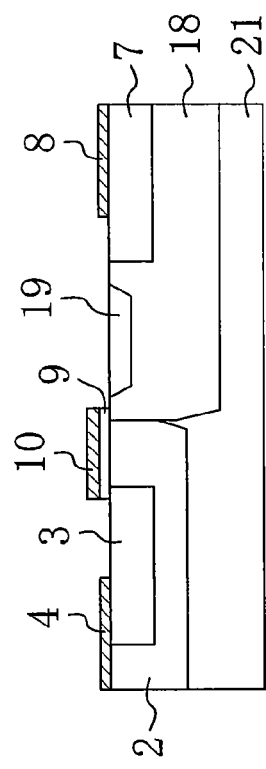
FIGS. 16B and 16C are cross-sectional views taken along the lines A-A' and B-B' in FIG. 16A, respectively.
Figure 16C:
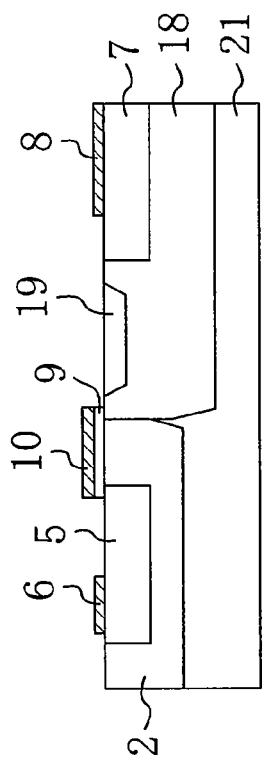
Figure 16A:
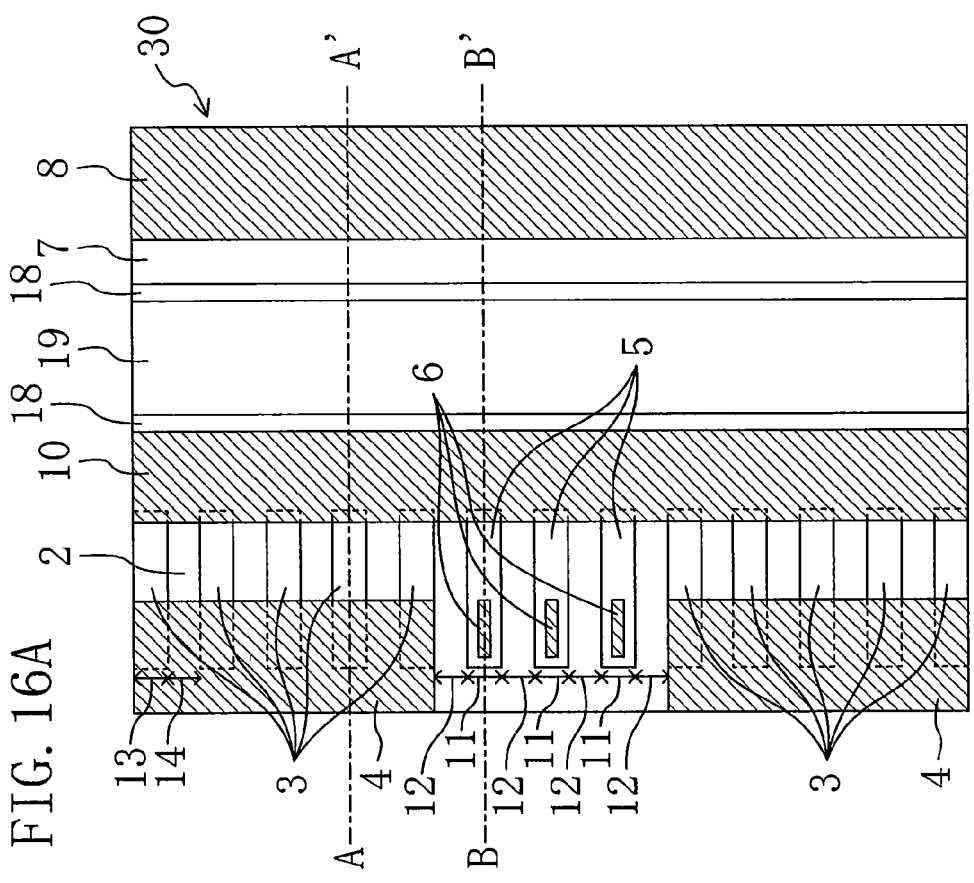
FIG. 16A is a plan view of a high-voltage semiconductor switching element (including a top semiconductor layer) according to the second modified example of the first through tenth embodiments of the invention.
Figure 19:
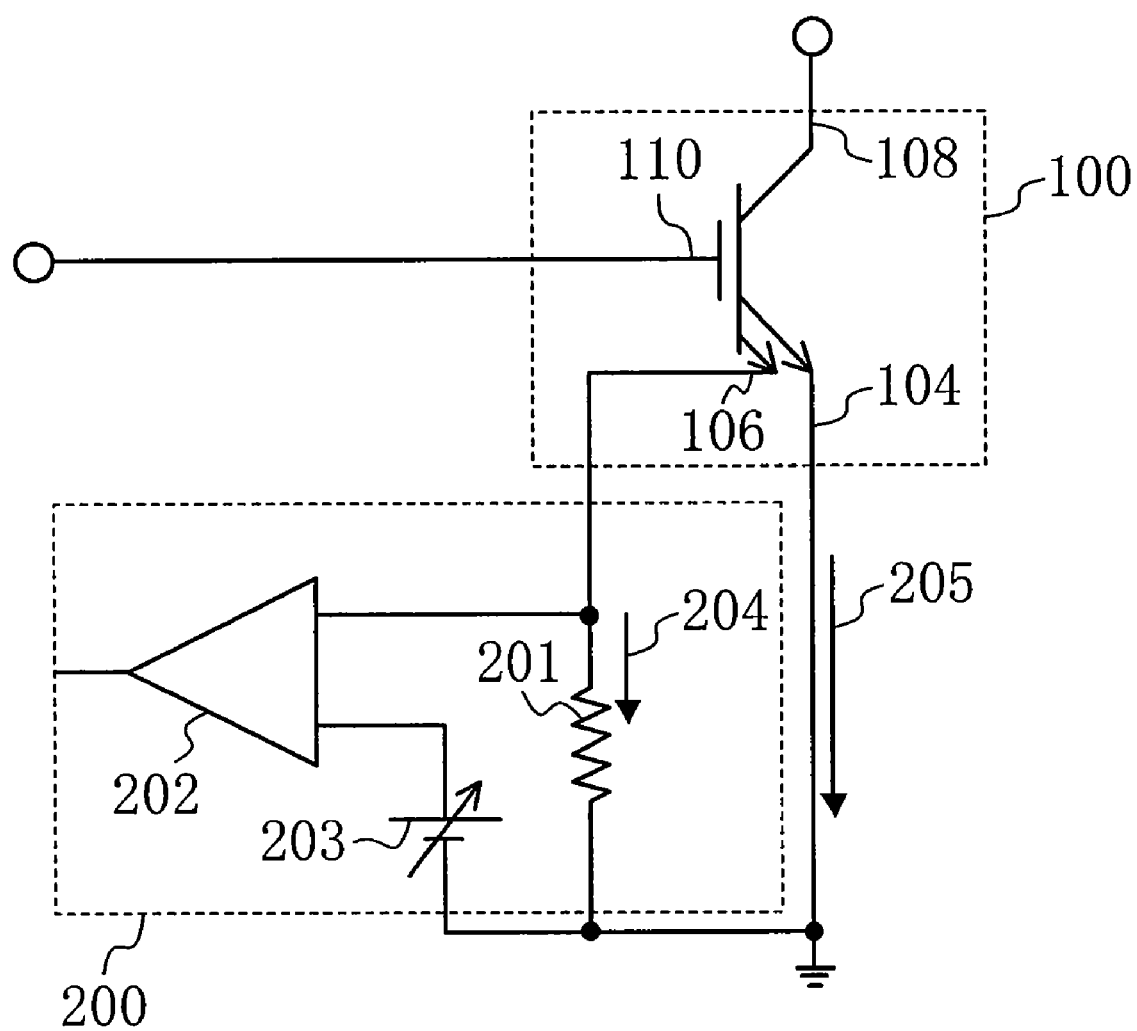
FIG. 19 illustrates an example of the rough circuit configuration of a semiconductor device having an overcurrent protection function for the conventional lateral IGBT.

FIG. 16A is a plan view of the high-voltage semiconductor switching element of this modified example illustrated in FIGS. 15A to 15C in which a P-type top semiconductor layer 19 is formed in a surface portion of the N-type resurf region 18 so as to be spaced away from the P-type collector region 7. FIGS. 16B and 16C are cross-sectional views taken along the lines A-A' and B-B' in FIG. 16A, respectively. In this high-voltage semiconductor switching element, the P-type top semiconductor layer 19 is electrically connected with the P-type base region 2. Since the base region 2 and the emitter regions 3 are electrically connected with each other, the top semiconductor layer 19 and the emitter regions 3 have the same potential. Also, as shown in FIG. 16A, the top semiconductor layer 19 may be formed continuously in a second direction perpendicular to a first direction going from the collector region 7 toward the base region 2. Furthermore, in a case in which a drain region is formed in the resurf region 18 to obtain a hybrid IGBT configuration, the top semiconductor layer 19 is formed so as to be spaced away from that drain region.

FIG. 17A is a plan view of the high-voltage semiconductor switching element of this modified example illustrated in FIGS. 15A to 15C in which a P-type buried semiconductor layer 20 is formed in an inner portion of the N-type resurf region 18 so as to be spaced away from the P-type collector region 7. FIGS. 17B and 17C are cross-sectional views taken along the lines A-A' and B-B' in FIG. 17A, respectively. In this high-voltage semiconductor switching element, the P-type buried semiconductor layer 20 is electrically connected with the P-type base region 2. Since the base region 2 and the emitter regions 3 are electrically connected with each other, the buried semiconductor layer 20 and the emitter regions 3 have the same potential. Also, the buried semiconductor layer 20 may be formed continuously in a second direction perpendicular to a first direction going from the collector region 7 toward the base region 2. Furthermore, in a case in which a drain region is formed in the resurf region 18 to obtain a hybrid IGBT configuration, the buried semiconductor layer 20 is formed so as so be spaced away from that drain region.

What is claimed is:

1. A high-voltage semiconductor switching element comprising:
   a base region of a first conductivity type formed in a semiconductor substrate of a second conductivity type;
   at least one emitter region of the second conductivity type selectively formed in the base region;
   at least one sense region of the second conductivity type selectively formed in the base region so as to be spaced away from the emitter region;
   a collector region of the first conductivity type formed in the semiconductor substrate so as to be spaced away from the base region;
   a gate insulating film formed at least on a part of the base region located closer to the collector region with respect to the emitter region;
   a gate electrode formed on the gate insulating film;
   a collector electrode formed above the semiconductor substrate and electrically connected with the collector region;
   an emitter electrode formed above the semiconductor substrate and electrically connected with both the base region and the emitter region; and
   a sense electrode formed above the semiconductor substrate and electrically connected with the sense region,
   wherein the emitter region and the sense region are located so as to be aligned in a second direction perpendicular to a first direction going from the collector region toward the base region; and
   the width of the sense region, the width of the emitter region, the width of a part of the base region that is adjacent to the sense region, and the width of a part of the base region that is adjacent to the emitter region in the second direction are set in such a manner that a sense ratio, which is a ratio of a collector current to a sense current, varies in a desired manner in accordance with variation in the collector current.

2. A high-voltage semiconductor switching element comprising:
   a base region of a first conductivity type formed in a semiconductor substrate of a second conductivity type;
   at least one emitter region of the second conductivity type selectively formed in the base region;
   at least one sense region of the second conductivity type selectively formed in the base region so as to be spaced away from the emitter region;
   a collector region of the first conductivity type formed in the semiconductor substrate so as to be spaced away from the base region;
   a drain region of the second conductivity type formed in the semiconductor substrate so as to be spaced away from the base region;
   a gate insulating film formed at least on a part of the base region located closer to the collector region with respect to the emitter region;
   a gate electrode formed on the gate insulating film;
   a collector electrode formed above the semiconductor substrate and electrically connected with both the collector region and the drain region;
   an emitter electrode formed above the semiconductor substrate and electrically connected with both the base region and the emitter region; and
   a sense electrode formed above the semiconductor substrate and electrically connected with the sense region, wherein the emitter region and the sense region are located so as to be aligned in a second direction perpendicular to a first direction going from the collector region toward the base region; and the width of the sense region, the width of the emitter region, the width of a part of the base region that is adjacent to the sense region, and the width of a part of the base region that is adjacent to the emitter region in the second direction are set in such a manner that a ratio of a collector current to a sense current varies in a desired manner in accordance with variation in the collector current.

3. The high-voltage semiconductor switching element of claim 2, wherein the sense region and the collector region are located so as to face each other with the gate electrode interposed therebetween.

4. The high-voltage semiconductor switching element of claim 2, wherein the sense region and the drain region are located so as to face each other with the gate electrode interposed therebetween.

5. The high-voltage semiconductor switching element of claim 2, wherein a plurality of the sense regions are formed; and at least one of the sense regions and the collector region are located so as to face each other with the gate electrode interposed therebetween, and the other sense regions and the drain region are located so as to face each other with the gate electrode interposed therebetween.

6. The high-voltage semiconductor switching element of claim 1, wherein a ratio of the width of the part of the base region that is adjacent to the sense region to the width of the sense region in the second direction is set equal to a ratio of the width of the part of the base region that is adjacent to the emitter region to the width of the emitter region in the second direction, thereby making the sense ratio be kept constant irrespective of the variation in the collector current.

7. The high-voltage semiconductor switching element of claim 2, wherein a ratio of the width of the part of the base region that is adjacent to the sense region to the width of the sense region in the second direction is set equal to a ratio of the width of the part of the base region that is adjacent to the emitter region to the width of the emitter region in the second direction, thereby making the sense ratio be kept constant irrespective of the variation in the collector current.

8. The high-voltage semiconductor switching element of claim 6, wherein the width of the sense region, the width of the emitter region, the width of the part of the base region that is adjacent to the sense region, and the width of the part of the base region that is adjacent to the emitter region in the second direction are set equal to each other.

9. The high-voltage semiconductor switching element of claim 7, wherein the width of the sense region, the width of the emitter region, the width of the part of the base region that is adjacent to the sense region, and the width of the part of the base region that is adjacent to the emitter region in the second direction are set equal to each other.

10. The high-voltage semiconductor switching element of claim 1, wherein a ratio of the width of the part of the base region that is adjacent to the sense region to the width of the sense region in the second direction is set greater than a ratio of the width of the part of the base region that is adjacent to the emitter region to the width of the emitter region in the second direction, thereby making the sense ratio increase as the collector current increases.

11. The high-voltage semiconductor switching element of claim 2, wherein a ratio of the width of the part of the base region that is adjacent to the sense region to the width of the sense region in the second direction is set greater than a ratio of the width of the part of the base region that is adjacent to the emitter region to the width of the emitter region in the second direction, thereby making the sense ratio increase as the collector current increases.

12. The high-voltage semiconductor switching element of claim 1, wherein a ratio of the width of the part of the base region that is adjacent to the sense region to the width of the sense region in the second direction is set smaller than a ratio of the width of the part of the base region that is adjacent to the emitter region to the width of the emitter region in the second direction, thereby making the sense ratio decrease as the collector current increases.

13. The high-voltage semiconductor switching element of claim 2, wherein a ratio of the width of the part of the base region that is adjacent to the sense region to the width of the sense region in the second direction is set smaller than a ratio of the width of the part of the base region that is adjacent to the emitter region to the width of the emitter region in the second direction, thereby making the sense ratio decrease as the collector current increases.

14. A high-voltage semiconductor switching element comprising:

a base region of a first conductivity type formed in a semiconductor substrate of a second conductivity type;

at least one emitter region of the second conductivity type selectively formed in the base region;

at least one sense region of the second conductivity type selectively formed in the base region so as to be spaced away from the emitter region;

a collector region of the first conductivity type formed in the semiconductor substrate so as to be spaced away from the base region;

a gate insulating film formed at least on a part of the base region located closer to the collector region with respect to the emitter region;

a gate electrode formed on the gate insulating film;

a collector electrode formed above the semiconductor substrate and electrically connected with the collector region;

an emitter electrode formed above the semiconductor substrate and electrically connected with both the base region and the emitter region; and a sense electrode formed above the semiconductor substrate and electrically connected with the sense region, wherein the emitter region and the sense region are located so as to be aligned in a second direction perpendicular to a first direction going from the collector region toward the base region; and the resistance of a part of the emitter region that is located between the emitter electrode and the gate electrode is equal to the resistance of a part of the sense region that is located between the sense electrode and the gate electrode.

15. A high-voltage semiconductor switching element comprising:

a base region of a first conductivity type formed in a semiconductor substrate of a second conductivity type;

at least one emitter region of the second conductivity type selectively formed in the base region;

at least one sense region of the second conductivity type selectively formed in the base region so as to be spaced away from the emitter region;

a collector region of the first conductivity type formed in the semiconductor substrate so as to be spaced away from the base region;

a drain region of the second conductivity type formed in the semiconductor substrate so as to be spaced away from the base region;

a gate insulating film formed at least on a part of the base region located closer to the collector region with respect to the emitter region;

a gate electrode formed on the gate insulating film;

a collector electrode formed above the semiconductor substrate and electrically connected with both the collector region and the drain region;

an emitter electrode formed above the semiconductor substrate and electrically connected with both the base region and the emitter region; and a sense electrode formed above the semiconductor substrate and electrically connected with the sense region, wherein the emitter region and the sense region are located so as to be aligned in a second direction perpendicular to a first direction going from the collector region toward the base region; and the resistance of a part of the emitter region that is located between the emitter electrode and the gate electrode is equal to the resistance of a part of the sense region that is located between the sense electrode and the gate electrode.

16. The high-voltage semiconductor switching element of claim 15, wherein the sense region and the collector region are located so as to face each other with the gate electrode interposed therebetween.

17. The high-voltage semiconductor switching element of claim 15, wherein the sense region and the drain region are located so as to face each other with the gate electrode interposed therebetween.

18. The high-voltage semiconductor switching element of claim 15, wherein a plurality of the sense regions are formed; and at least one of the sense regions and the collector region are located so as to face each other with the gate electrode interposed therebetween, and the other sense regions and the drain region are located so as to face each other with the gate electrode interposed therebetween.

19. The high-voltage semiconductor switching element of claim 14, wherein the width of the emitter region and the width of the sense region in the second direction are equal to each other, and the length of the part of the emitter region that is located between the emitter electrode and the gate electrode is equal to the length of the part of the sense region that is located between the sense electrode and the gate electrode.

20. The high-voltage semiconductor switching element of claim 15, wherein the width of the emitter region and the width of the sense region in the second direction are equal to each other, and the length of the part of the emitter region that is located between the emitter electrode and the gate electrode is equal to the length of the part of the sense region that is located between the sense electrode and the gate electrode.

21. The high-voltage semiconductor switching element of claim 1, wherein a plurality of the sense regions are formed; and the emitter region is located between one of the sense regions and another one of the sense regions.

22. The high-voltage semiconductor switching element of claim 2, wherein a plurality of the sense regions are formed; and the emitter region is located between one of the sense regions and another one of the sense regions.

23. The high-voltage semiconductor switching element of claim 14, wherein a plurality of the sense regions are formed; and the emitter region is located between one of the sense regions and another one of the sense regions.

24. The high-voltage semiconductor switching element of claim 15, wherein a plurality of the sense regions are formed; and the emitter region is located between one of the sense regions and another one of the sense regions.

25. The high-voltage semiconductor switching element of claim 1, wherein the semiconductor substrate is of the first conductivity type;

the high-voltage semiconductor switching element further includes a resurf region of the second conductivity type formed in the semiconductor substrate so as to be adjacent to the base region; and the collector region is formed in the resurf region.

26. The high-voltage semiconductor switching element of claim 2, wherein the semiconductor substrate is of the first conductivity type;

the high-voltage semiconductor switching element further includes a resurf region of the second conductivity type formed in the semiconductor substrate so as to be adjacent to the base region; and the collector region is formed in the resurf region.

27. The high-voltage semiconductor switching element of claim 14, wherein the semiconductor substrate is of the first conductivity type;

the high-voltage semiconductor switching element further includes a resurf region of the second conductivity type formed in the semiconductor substrate so as to be adjacent to the base region; and the collector region is formed in the resurf region.

28. The high-voltage semiconductor switching element of claim 15, wherein the semiconductor substrate is of the first conductivity type;

the high-voltage semiconductor switching element further includes a resurf region of the second conductivity type formed in the semiconductor substrate so as to be adjacent to the base region; and the collector region is formed in the resurf region.

29. The high-voltage semiconductor switching element of claim 25, further comprising a top semiconductor layer of the first conductivity type formed in a surface portion of the resurf region, wherein the top semiconductor layer is electrically connected with the base region.

30. The high-voltage semiconductor switching element of claim 26, further comprising a top semiconductor layer of the first conductivity type formed in a surface portion of the resurf region, wherein the top semiconductor layer is electrically connected with the base region.

31. The high-voltage semiconductor switching element of claim 27, further comprising a top semiconductor layer of the first conductivity type formed in a surface portion of the resurf region, wherein the top semiconductor layer is electrically connected with the base region.

32. The high-voltage semiconductor switching element of claim 28, further comprising a top semiconductor layer of the first conductivity type formed in a surface portion of the resurf region, wherein the top semiconductor layer is electrically connected with the base region.

33. The high-voltage semiconductor switching element of claim 25, further comprising a buried semiconductor layer of the first conductivity type formed in the resurf region, wherein the buried semiconductor layer is electrically connected with the base region.

34. The high-voltage semiconductor switching element of claim 26, further comprising a buried semiconductor layer of the first conductivity type formed in the resurf region,
wherein the buried semiconductor layer is electrically connected with the base region.

35. The high-voltage semiconductor switching element of claim 27, further comprising a buried semiconductor layer of the first conductivity type formed in the resurf region,
wherein the buried semiconductor layer is electrically connected with the base region.

36. The high-voltage semiconductor switching element of claim 28, further comprising a buried semiconductor layer of the first conductivity type formed in the resurf region,
wherein the buried semiconductor layer is electrically connected with the base region.

* * * * *